(12) United States Patent
Tanaka et al.

(10) Patent No.: US 7,060,990 B2
(45) Date of Patent: Jun. 13, 2006

(54) STAGE BASE, SUBSTRATE PROCESSING APPARATUS, AND MAINTENANCE METHOD FOR STAGE

(75) Inventors: Toshiharu Tanaka, Niihama (JP); Itsushi Iio, Niihama (JP); Tsutomu Miyatake, Niihama (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 0 days.

(21) Appl. No.: 10/866,987

(22) Filed: Jun. 15, 2004

(65) Prior Publication Data

US 2004/0259364 A1   Dec. 23, 2004

(30) Foreign Application Priority Data

Jun. 16, 2003 (JP) ............................ P2003-170954
Jun. 20, 2003 (JP) ............................ P2003-177025

(51) Int. Cl.
*H01L 21/302* (2006.01)

(52) U.S. Cl. ............... 250/442.11; 438/690; 355/51.53; 108/20

(58) Field of Classification Search ........... 250/442.11; 438/690; 355/51, 53; 108/20
See application file for complete search history.

(56) References Cited

U.S. PATENT DOCUMENTS

| 6,529,260 B1 * | 3/2003 | Sogard | 355/39 |
| 2002/0015140 A1 * | 2/2002 | Yoda | 355/53 |
| 2002/0018192 A1 * | 2/2002 | Nishi | 355/53 |

FOREIGN PATENT DOCUMENTS

| JP | 4-171715 | 6/1992 |
| JP | 2000-58629 | 2/2000 |
| JP | 2002-252275 | 9/2002 |

* cited by examiner

Primary Examiner—Nikita Wells
Assistant Examiner—Zia R. Hashmi
(74) Attorney, Agent, or Firm—Arent Fox PLLC

(57) ABSTRACT

A stage base comprises a base body, an elevator, and a shifter. The base body has a bottom face facing a reference surface. The elevator is attached to the base body and operative to move the base body in a vertical direction with respect to the reference surface. The shifter is attached to the elevator. The shifter enables the base body to move along the reference surface.

16 Claims, 32 Drawing Sheets

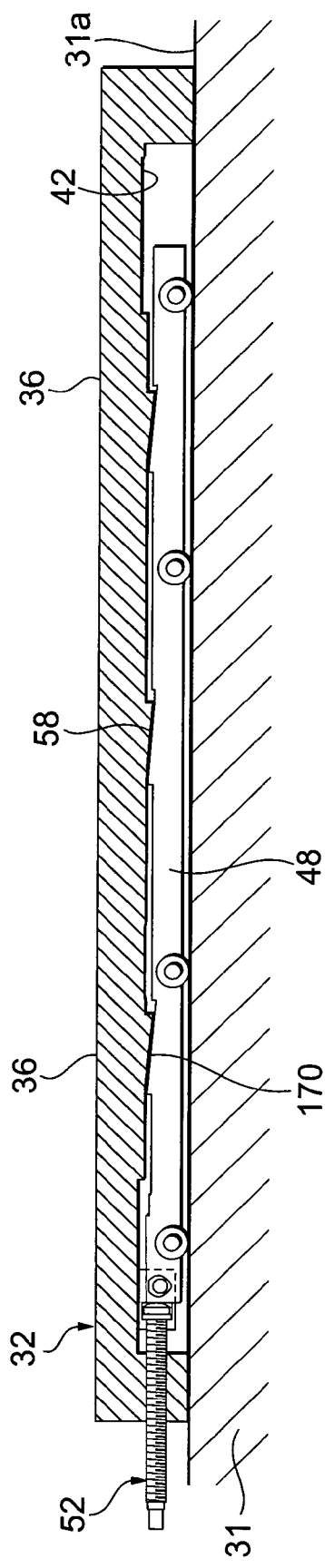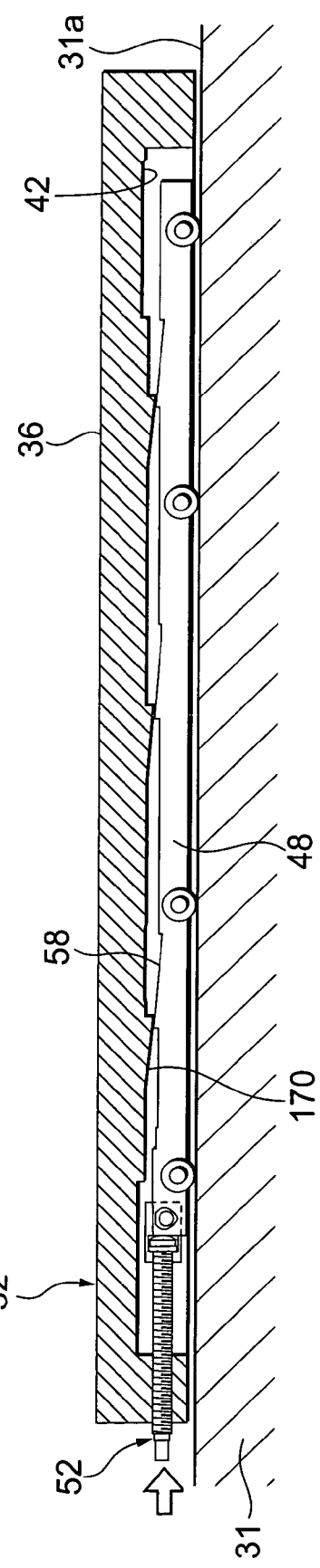

STAGE BASE, SUBSTRATE PROCESSING APPARATUS, AND MAINTENANCE METHOD FOR STAGE

BACKGROUND OF THE INVENTION

1. Field of the Invention

The present invention relates to a stage base, a substrate processing apparatus, and a maintenance method for a stage which are suitable for making a semiconductor device, for example.

2. Related Background Art

As a substrate processing apparatus, a lithography system utilizing an electron beam is equipped with a vacuum chamber. The upper wall of the vacuum chamber is provided with an irradiation unit for emitting the electron beam, whereas a wafer stage for positioning and holding a semiconductor wafer is disposed within the vacuum chamber.

For example, the electron beam lithography system disclosed in Japanese Patent Application Laid-Open No. HEI 4-171715 comprises a wafer stage including X and Y tables for positioning and holding a semiconductor wafer, and further comprises a stage base for mounting the wafer stage.

In this lithography system, the Y table is mounted on the X table so as to be movable along the Y axis. The X table is mounted on the stage base so as to be movable along the X axis. By way of wheels attached to side faces extending along the Y axis, the stage base is made movable on a reference surface of the main chamber.

In such a lithography system, the stage base is positioned by being connected to a side wall part of the vacuum chamber. At the time of maintenance for the wafer stage, the stage base and the side wall part are drawn together in the Y direction, so that the maintenance for the wafer stage can be performed on the outside of the vacuum chamber.

SUMMARY OF THE INVENTION

However, since the stage base in the above-mentioned conventional substrate processing apparatus is mounted on the reference surface of the vacuum chamber by way of wheels and is likely to flex because of the load received from the wheels attached to both side faces, straightness is hard to attain in the wafer stage, which makes it difficult for the semiconductor wafer to yield levelness.

In proximity exposure utilizing electron beams in particular, a mask and a semiconductor wafer are disposed close to each other with a distance therebetween on the order of several micrometers to several tens of micrometers, so that the levelness in the semiconductor wafer is quite important for accurately projecting the beam onto the semiconductor wafer without interfering with the mask.

Since the sub-chamber and side wall parts of the above-mentioned conventional exposure apparatus are quite heavy in weight, the operation of drawing out the wafer stage together with them is hard work and may require special tools such as crane, which complicates its maintenance.

In view of the foregoing circumstances, it is an object of the present invention to provide a stage base, a substrate processing apparatus, and a stage maintenance method which make it possible to realize a high straightness without deteriorating the maintenance property. It is another object of the present invention to provide a substrate processing apparatus which can improve the maintenance property.

The present invention provides a stage base comprising a base body, an elevator, and a shifter. The base body has a bottom face facing a reference surface. The elevator is attached to the base body and operative to move the base body in a vertical direction with respect to the reference surface. The shifter is attached to the elevator. The shifter enables the base body to move along the reference surface.

Since the bottom face of the base body is able to come into contact with the reference surface, this stage base is easy to realize a high straightness. Also, the base body can be detached from the reference surface by the elevator and can easily be moved on the reference surface by the shifter, whereby there is no fear of deteriorating the maintenance property.

Preferably, the bottom face includes a recess. Preferably, the elevator and the shifter are accommodated in the recess. In this case, the space can be utilized effectively. As a consequence, employing this stage base in a vacuum chamber can restrain the chamber from increasing its size and alleviate the load on a vacuum pump and the like.

Preferably, the elevator has a support having an upper face including a first inclined surface tilted with respect to the reference surface; a guide, attached to the base body, having a lower face including a second inclined surface in contact with the first inclined surface; and an operating part connected to the support and operative to slide the support with respect to the guide. When the operating part causes the support to slide with respect to the guide, the second inclined surface ascends or descends while sliding on the first inclined surface, whereby the base body moves in a vertical direction with respect to the reference surface.

Preferably, the shifter includes a wheel attached to the support. In this case, rotations of the wheel make it easier to move the stage base.

The present invention provides a substrate processing apparatus comprising the above-mentioned stage base; a stage mounted on the stage base and operative to position the substrate; a chamber accommodating the stage base mounted with the stage, the chamber having a side wall including an opening that allows the stage base mounted with the stage to pass through; and a door, attached to the chamber, that covers the opening.

In this substrate processing apparatus, the stage base mounted with the stage can be drawn from the opening by opening the door for easy maintenance.

Preferably, the substrate processing apparatus is a proximity exposure apparatus utilizing an electron beam.

The present invention provides a stage base comprising a base body, an elevator. The base body has a bottom face facing a reference surface. The elevator is attached to the base body and operative to move the base body in a vertical direction with respect to the reference surface. The stage base is movable along the reference surface when the base body has been raised by the elevator so as to be detached from the reference surface.

The present invention provides a stage base comprising a base body having a bottom face facing a reference surface, an elevator for moving the base body in a vertical direction with respect to the reference surface, and a shifter for enabling the base body to move along the reference surface.

A stage maintenance method in accordance with the present invention includes the steps of moving a base body in a vertical direction so as to be detached from a reference surface, and drawing the base body mounted with a stage out of a chamber by moving the base body along the reference surface. This method can easily draw the stage out of the chamber together with the stage base, thereby facilitating the maintenance of the stage.

The present invention provides a substrate processing apparatus comprising a main chamber, a sub-chamber disposed outside of the main chamber and attachable/detachable to the main chamber, and a container having a space that allows at least a part of the sub-chamber to be accommodated therein. Preferably, the sub-chamber is accommodated in the container when the sub-chamber has been detached from the main chamber.

By detaching the sub-chamber from the main chamber, the sub-chamber can be moved to and accommodated in the container in this substrate processing apparatus. Therefore, regardless of the sub-chamber, maintenance can easily be carried out on the main chamber side, whereby the maintenance property can be improved.

Preferably, a substrate holder positioning and holding the substrate is provided in the main chamber. Preferably, the sub-chamber has a driving rod extending in a predetermined direction, and a driving source displacing the driving rod in the predetermined direction, whereby the substrate holder can be positioned in the predetermined direction.

Preferably, the main chamber has a side wall part including an opening and a door covering the opening. Preferably, the driving rod of the sub-chamber is attachable/detachable to the substrate holder by way of a through hole provided in the door. In this case, the connection between the sub-chamber and main chamber is broken when the driving rod and the substrate holder are disconnected from each other. Opening the door allows the maintenance of the substrate holder.

Preferably, the substrate processing apparatus further comprises a guide mechanism attachable/detachable between the main chamber and the container, guiding a movement of the sub-chamber to and from the container. This makes it easier to move the sub-chamber.

Preferably, the substrate processing apparatus further comprises a housing movable on an installation surface. Preferably, the container is provided within the housing and accommodates at least a part of the sub-chamber attached to the main chamber when the housing is positioned adjacent the main chamber. In this case, the housing can be disposed adjacent the main chamber at the time of normal operation, whereby the footprint can be reduced.

Preferably, the substrate processing apparatus comprises a trestle, placed between the main chamber and the container, mounting the substrate holder drawn out of the main chamber through the opening. In this case, the substrate holder drawn out of the main chamber can be mounted on the trestle for maintenance.

The present invention will become more fully understood from the detailed description given hereinbelow and the accompanying drawings. They are given by way of illustration only, and thus should not be considered limitative of the present invention.

BRIEF DESCRIPTION OF THE DRAWINGS

FIG. 3A is a perspective view showing the configuration of a wafer stage and a stage base which are provided in the main chamber, whereas

FIG. 6A is a perspective view showing the configuration of a carriage of the elevator, whereas FIG. 6B is a side view showing the configuration of the carriage;

FIGS. 32A and 32B are sectional views showing a modified example of the stage base.

DETAILED DESCRIPTION OF THE PREFERRED EMBODIMENTS

In the following, embodiments of the present invention will be explained with reference to the accompanying drawings. In the explanation of the drawings, constituents identical to each other will be referred to with numerals identical to each other without repeating their overlapping descriptions.

Figure 1:
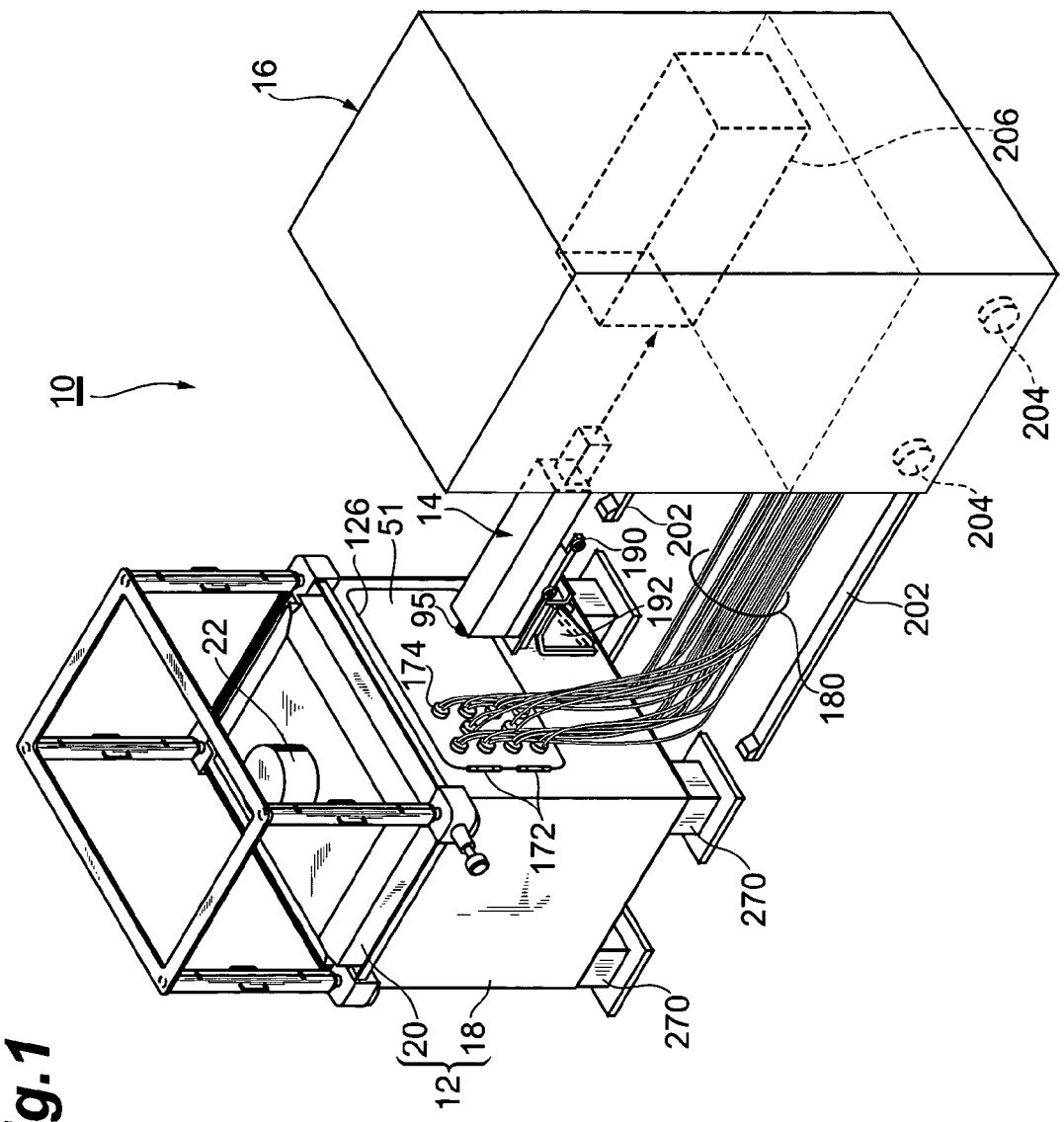
FIG. 1 is a perspective view showing the configuration of the electron beam exposure apparatus in accordance with an embodiment (in a state where a control console is located at a maintenance position)

FIG. 1 is a perspective view showing the configuration of the electron beam exposure apparatus (which may also be simply referred to as "exposure apparatus" in the following). As shown in FIG. 1, this exposure apparatus 10 comprises a main chamber 12, a sub-chamber 14, and a control console 16.

Figure 2:
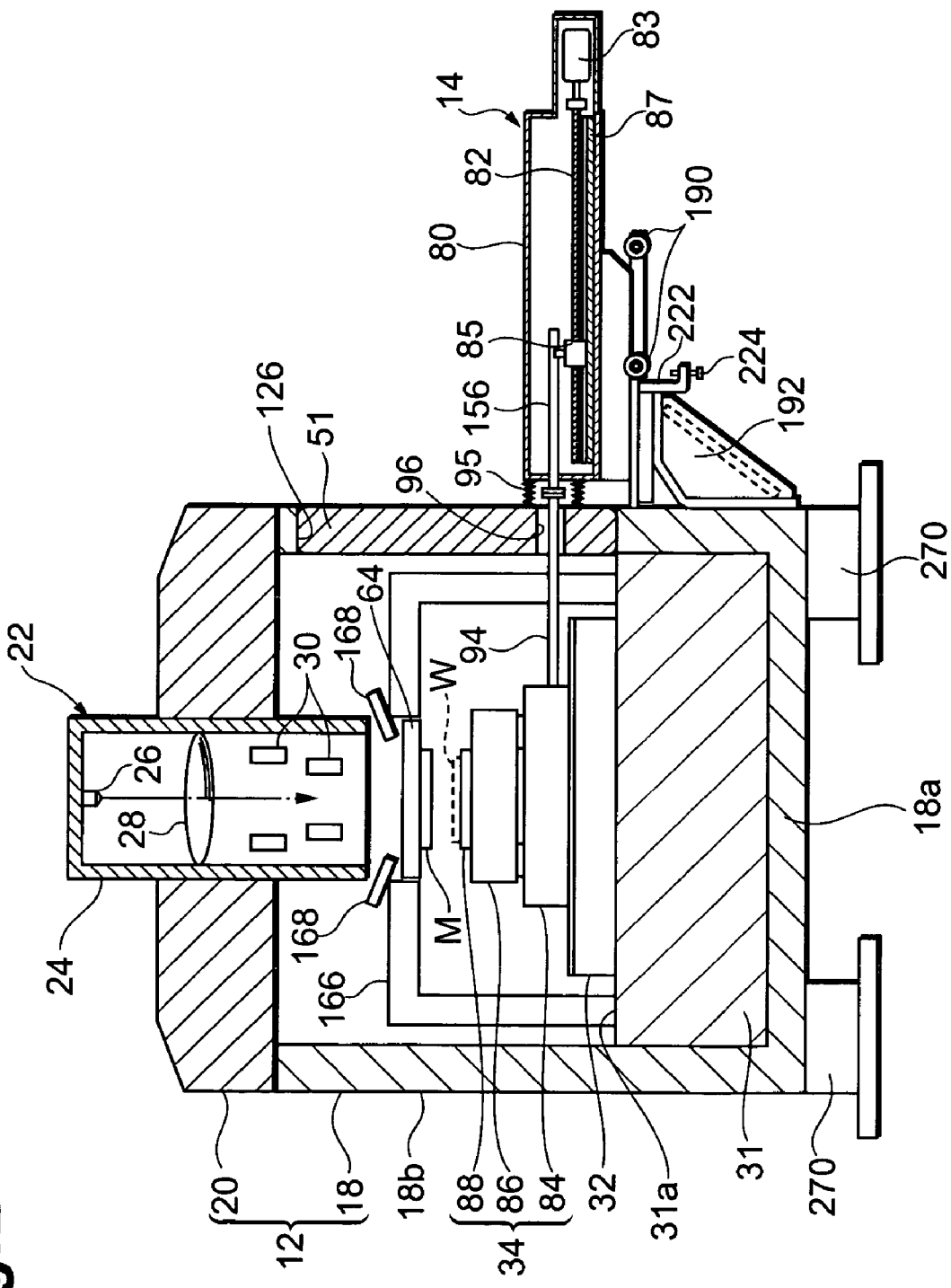
FIG. 2 is a sectional view showing the configuration of a main chamber and a sub-chamber.

FIG. 2 is a sectional view showing the configuration of the main chamber 12 and sub-chamber 14. The main chamber 12 comprises a container body 18 with an open upper end, and an upper lid 20 closing the upper opening of the container body 18.

The upper lid 20 has a rectangular horizontal cross section, whereas an electron beam irradiating part 22 for emitting an electron beam is disposed at the center thereof. The electron beam irradiating part 22 comprises an electron lens barrel 24 including an upper wall part and a side wall part, an electron gun 26 disposed at the upper wall part in the electron lens barrel 24, a lens 28 for collimating the electron beam emitted from the electron gun 26, and a deflector 30. The electron gun 26, lens 28, and deflector 30 are arranged in this order toward the vertically lower side, whereby the electron beam emitted from the electron gun 26 is collimated by the lens 28 and then is scanned with the deflector 30, so as to illuminate a semiconductor wafer W.

The container body 18 comprises a bottom wall part 18a having a rectangular horizontal cross section, and two sets of side wall parts 18b rising from edge portions of the bottom wall part 18a. Mounted on the bottom wall part 18a is a bed 31 having a straight upper face 31a acting as a reference surface. As shown in FIGS. 2 and 3, a stage base 32 is disposed on the bed 31 in the container body 18. A wafer stage 34 for positioning and holding the semiconductor wafer W, which is an object to be exposed to the electron beam, is mounted on the stage base 32.

The stage base 32 comprises a base body 36, elevators 38, and wheels 40. As shown in FIG. 4, the base body 36 has a rectangular form when seen as a plane. The base body 36 is formed from a mixed material of Si carbide and aluminum, for example, and is highly resistant to vibrations. The upper face (mounting surface) 36a and bottom face 36b of the base body 36 are parallel to each other and have a high straightness. The bottom face 36b of the base body 36 is provided with a pair of recesses 42 extending in a predetermined direction (X direction in FIG. 3A). One end of each of the recesses 42 extends to a side face of the base body 36 and is enlarged at the side face. Equally spaced four screw holes 44 are formed in the bottom face of each recess 42. The upper face 36a of the base body 36 is provided with a pair of projections 46 extending in a predetermined direction (X direction in FIG. 3A).

Figure 5:
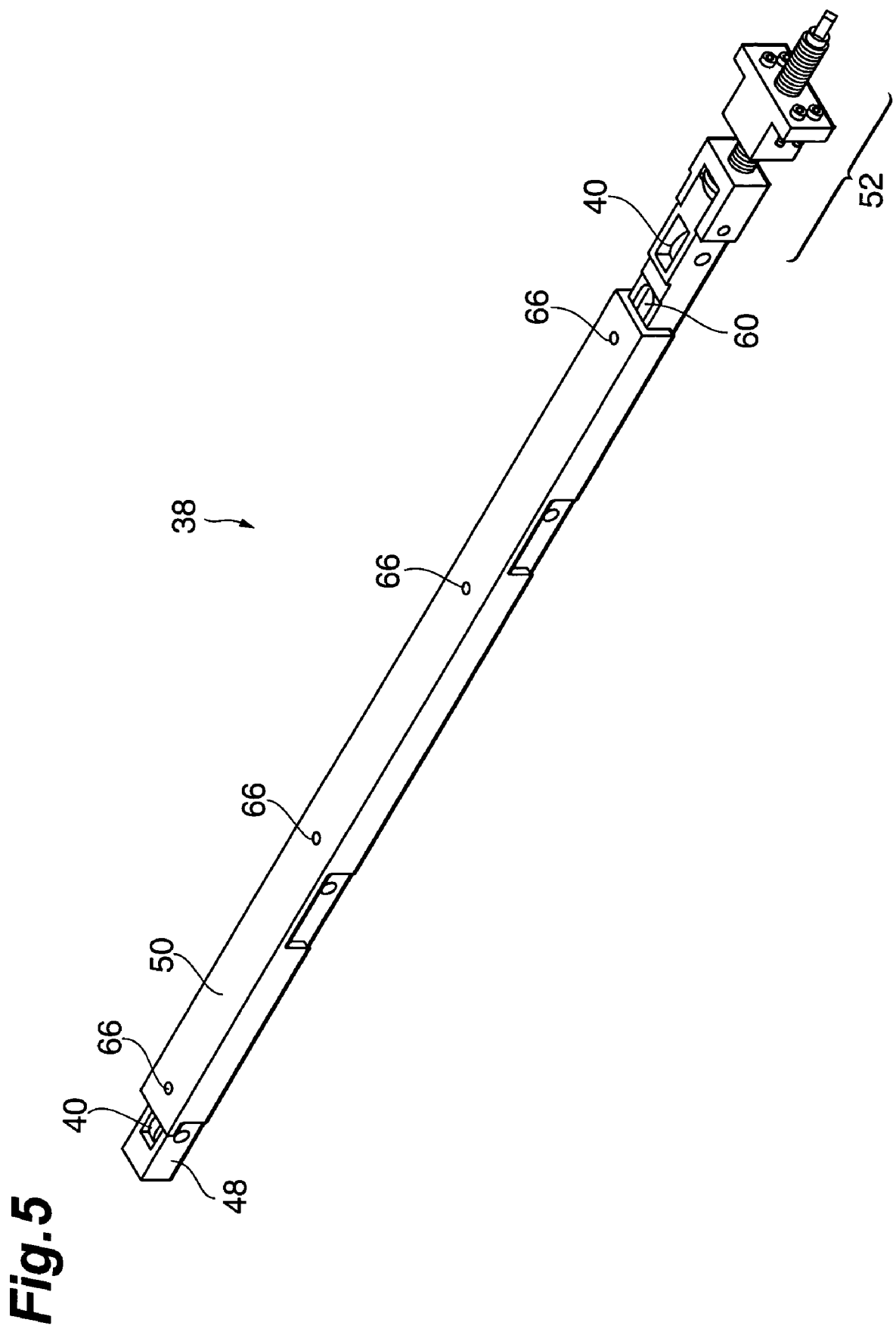
FIG. 5 is a perspective view showing the configuration of an elevator.
Figure 6:
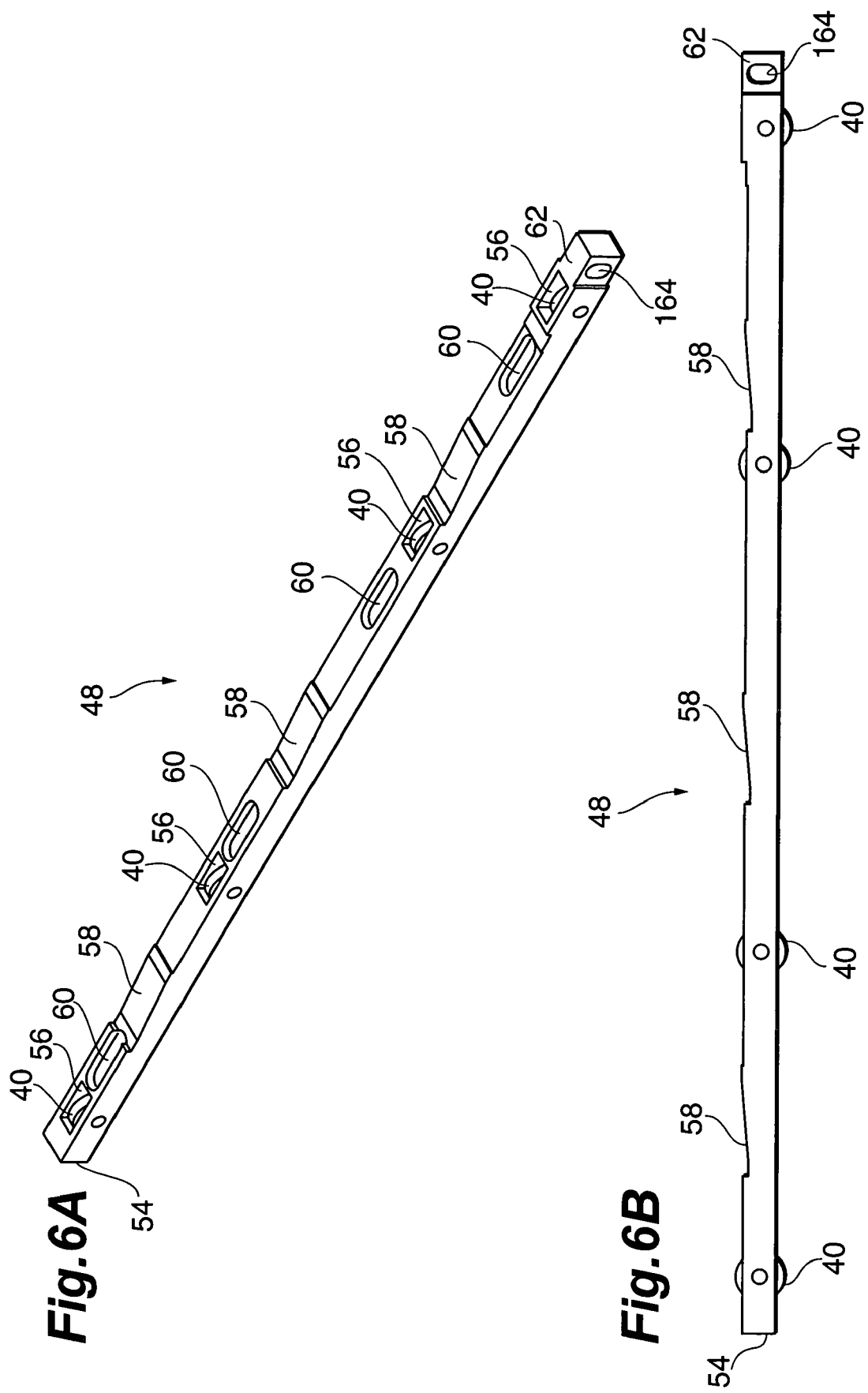

As shown in FIG. 5, each elevator 38 comprises a carriage 48, a guide 50, and an operating part 52. As shown in FIGS. 6A and 6B, the carriage 48 includes a support 54 having a substantially square cross section perpendicular to the longitudinal direction. This support 54 is provided with four wheel holes 56, each vertically penetrating through the support 54, which are equally spaced in the longitudinal direction, whereas the wheels (shifters) 40 are disposed in the respective wheel holes 56 so as to be rotatable. Each wheel 40 is partly exposed from the lower face of the support 54. The upper face of the support 54 is provided with three inclined surfaces (first inclined surfaces) 58. These inclined surfaces 58 alternate with the four wheel holes 56. The upper face of the support 54 is also provided with four recesses 60. The front end of the support 54 is narrowed so as to form an attachment 62 for attaching the operation part 52, which will be explained later. An elongated hole 164 penetrates through the attachment 62, whereas the major axis of the elongated hole 164 extends vertically.

Figure 7:
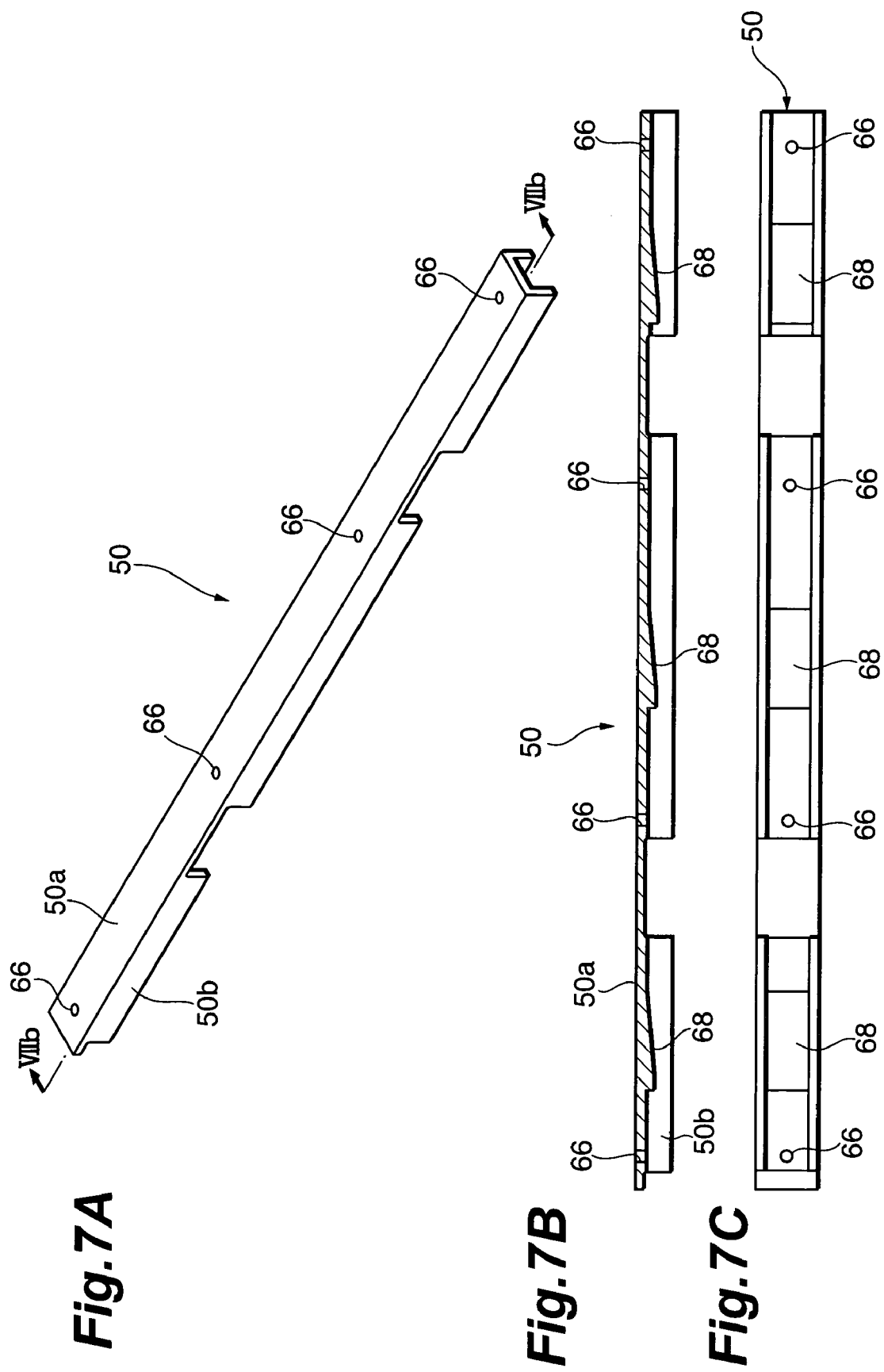
FIG. 7A is a perspective view showing the configuration of a guide of the elevator.
FIG. 7B is a sectional view taken along the line VIIb—VIIb of FIG. 7A.
FIG. 7C is a bottom view showing the configuration of the guide.

As shown in FIGS. 7A to 7C, the guide 50 comprises a board part 50a and side plate parts 50b made by bending both edges of the board part 50a, so that the cross section perpendicular to the longitudinal direction is substantially shaped like angular U. The board part 50a of the guide 50 is formed with equally spaced four holes 66. The lower face of the board part 50a is formed with three inclined surfaces (second inclined surfaces) 68. These inclined surfaces 68 alternate with the four holes 66.

The length of the guide 50 is slightly shorter than the support 54 of the carriage 48. The guide 50 fits into the upper face side of the support 54 of the carriage 48. In this state, the inclined surfaces 68 of the guide 50 and the inclined surfaces 58 of the carriage 48 come into contact with each other.

Figure 8:
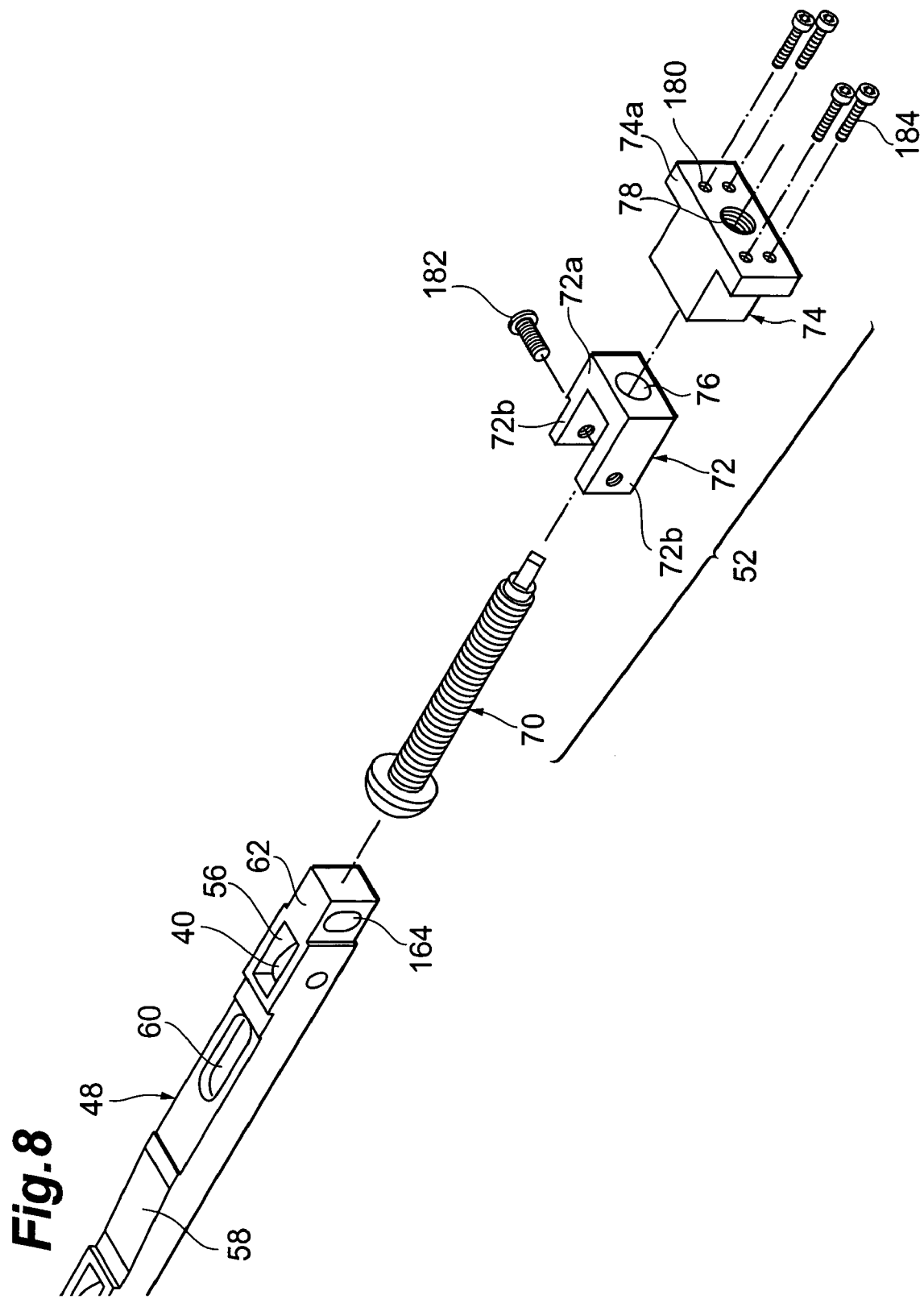
FIG. 8 is an exploded perspective view showing the configuration of an operating part of the elevator.

As shown in FIGS. 5 and 8, the operating part 52 comprises a screw rod 70 whose peripheral surface is formed with a male thread, a joint 72 having an angular U-shaped horizontal cross section, and an attachment member 74 having a horizontal cross section substantially shaped like T. The joint 72 comprises a bottom part 72a and a pair of projections 72b protruding from the bottom part 72a. The bottom part 72a is formed with a hole 76 through which the screw rod 70 is inserted. The attachment member 74 is formed with a female screw hole 78 through which the screw rod 70 is inserted. The attachment member 74 has a flange 74a formed with four screw holes 180.

As shown in FIGS. 5 and 8, the operating part 52 is constructed by inserting the screw rod 70 through the hole 76 of the joint 72 and further through the female screw hole 78 of the attachment member 74. When the attachment 62 of the carriage 48 is fitted between a pair of projections 72b of the joint 72, and a pin 182 bridges the pair of projections 72b through the elongated hole 164 formed in the attachment 62, the operating part 52 is connected to the carriage 48. Therefore, as the pin 182 is guided by the elongated hole 164, the operating part 52 can move up and down with respect to the carriage 48.

Figure 9:
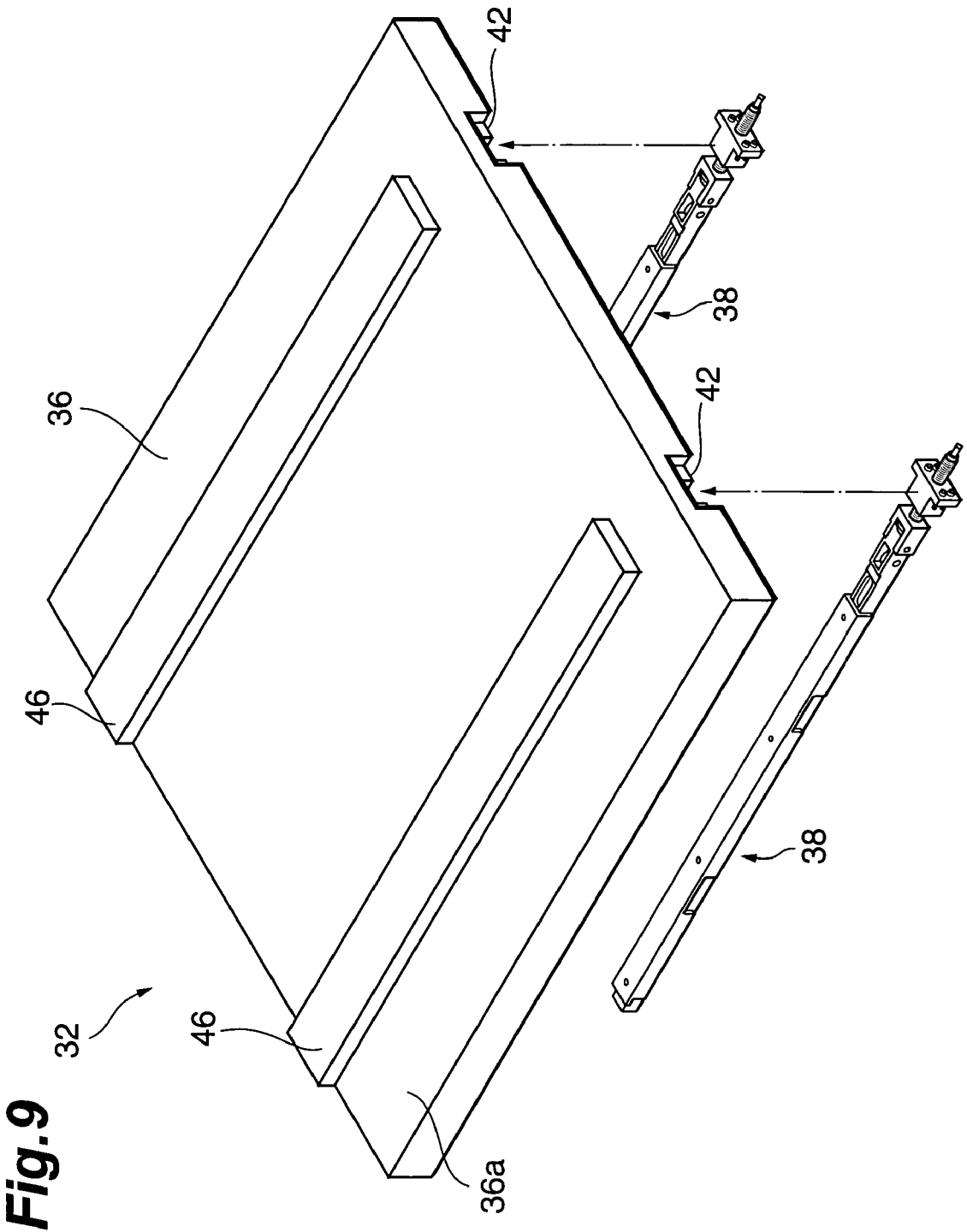
FIG. 9 is an exploded perspective view showing the configuration of the stage base.
Figure 10:
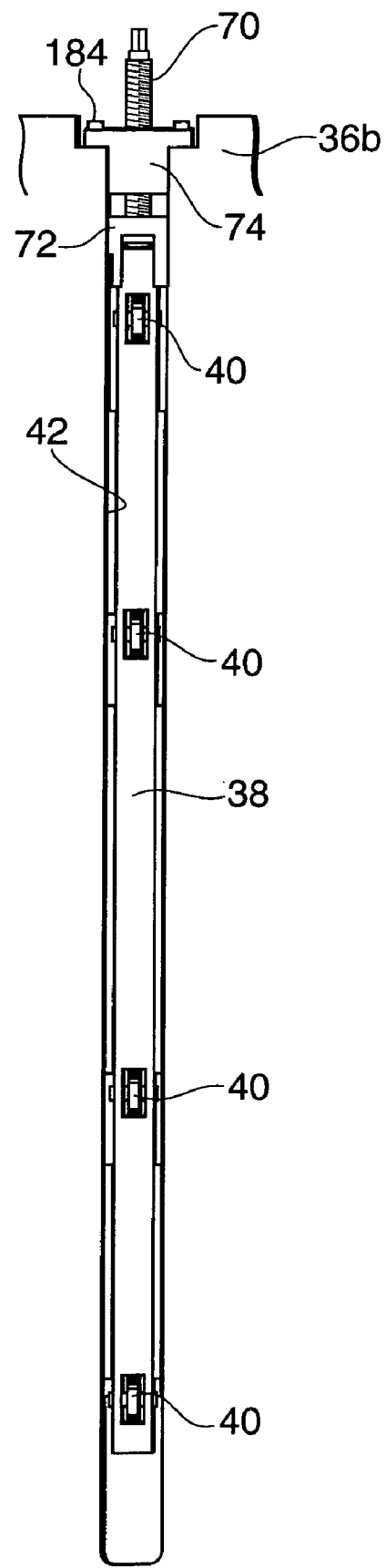
FIG. 10 is a view showing a state where the elevator is accommodated in and attached to a recess of the base body.

As shown in FIG. 9, thus configured elevators 38 are accommodated in the pair of recesses 42 formed in the bottom face 36b of the base body 36, respectively. Here, each guide 50 is fastened with screws inserted in the screw holes 44 formed in its corresponding recess 42 of the base body 36 by way of the four holes 66 formed in the board part 50a. As shown in FIG. 10, the operating part 52 is fastened to the expanded part of its corresponding recess 42 in the base body 36 with screws 184 inserted through the screw holes 180 formed in the flange 74a of the attachment member 74.

Figure 11:
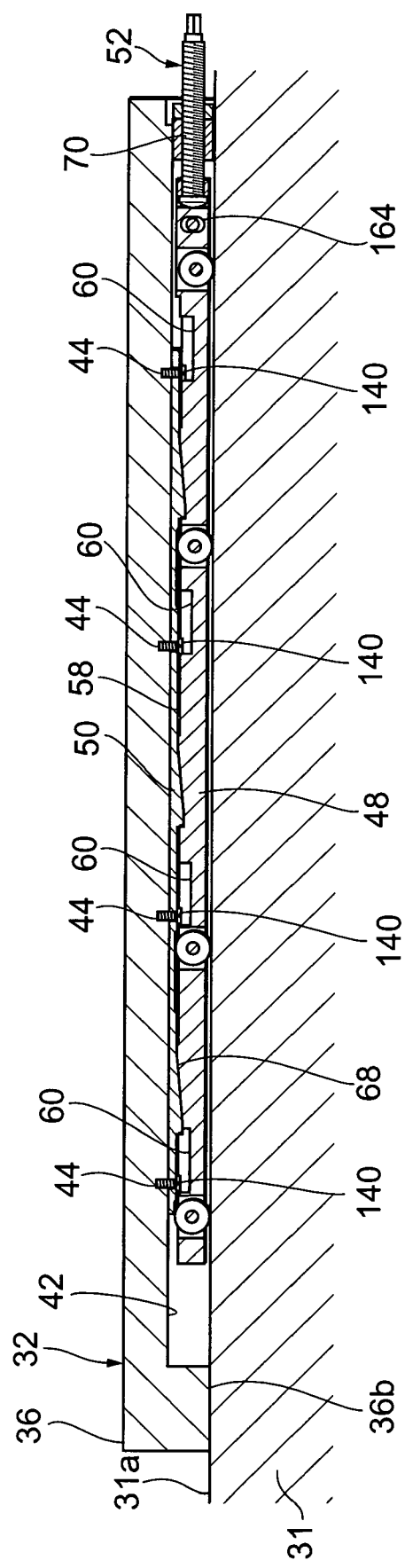
FIG. 11 is a sectional view showing a state where the base body descends at the time of exposure processing, so that the bottom face of the base body is in contact with the upper face of a bed.

FIG. 11 is a sectional view showing a state where the elevator 38 is accommodated in the recess 42 of the base body 36. At the time of exposure processing, the bottom face 36b of the base body 36 is in contact with the upper face 31a of the bed 31.

Figure 3A:
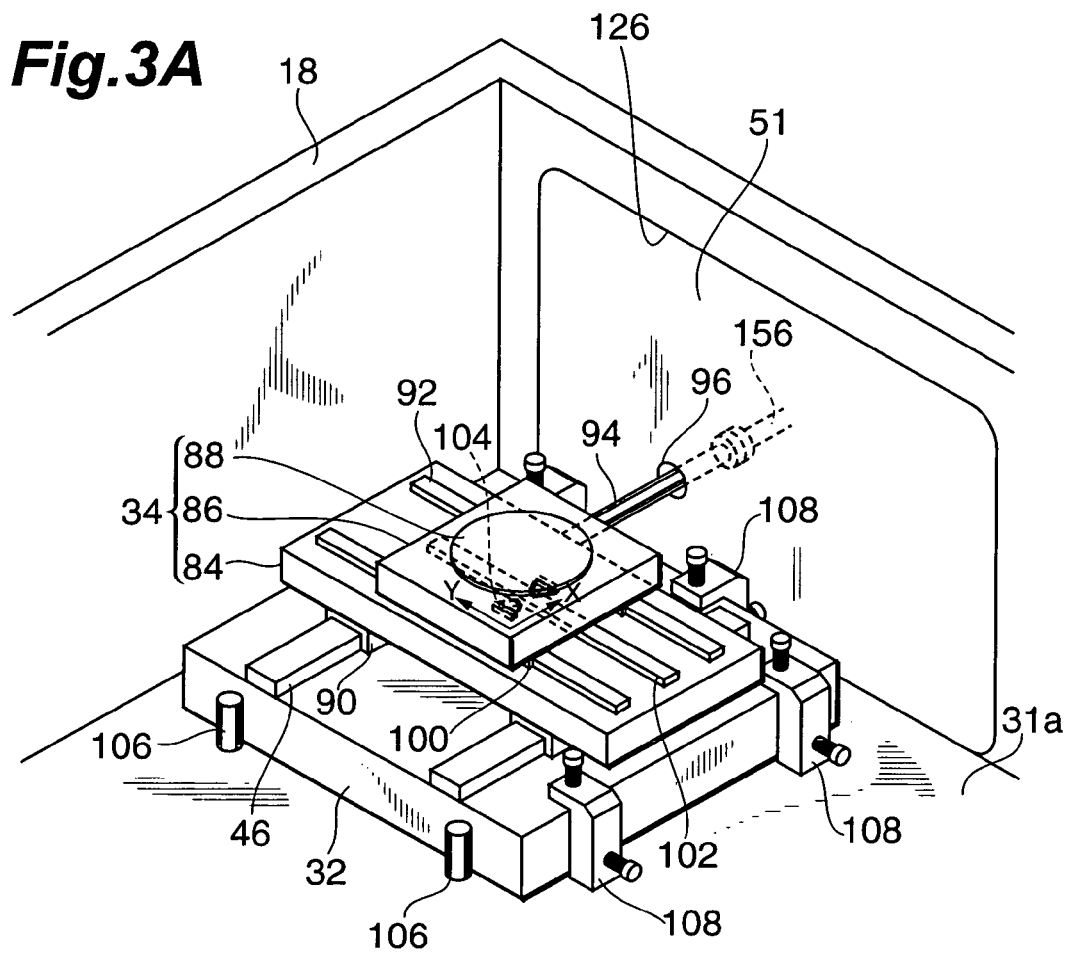
Figure 4A:
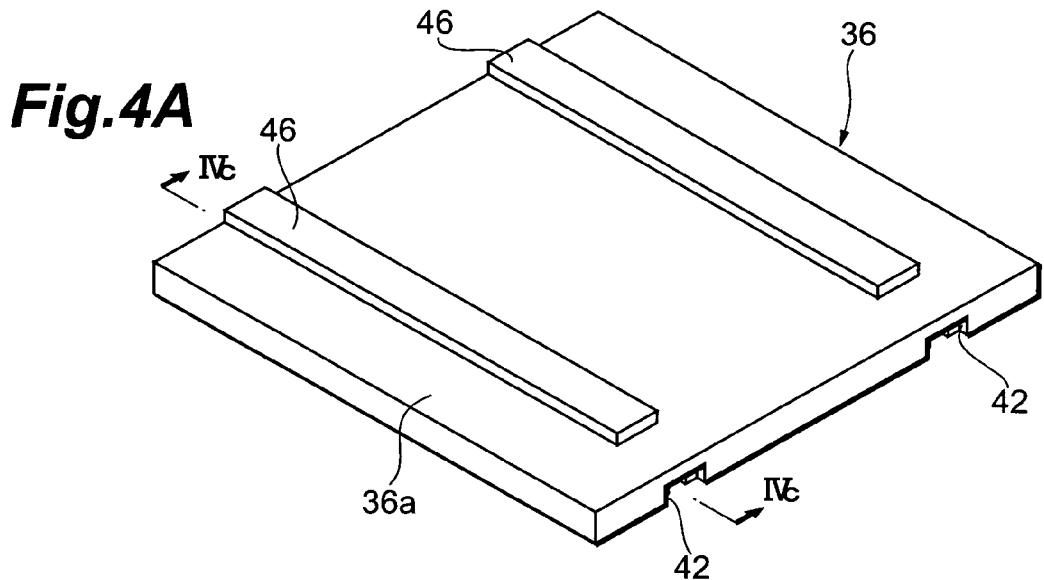
FIG. 4A is a perspective view showing a base body as seen from thereabove.
Figure 4B:
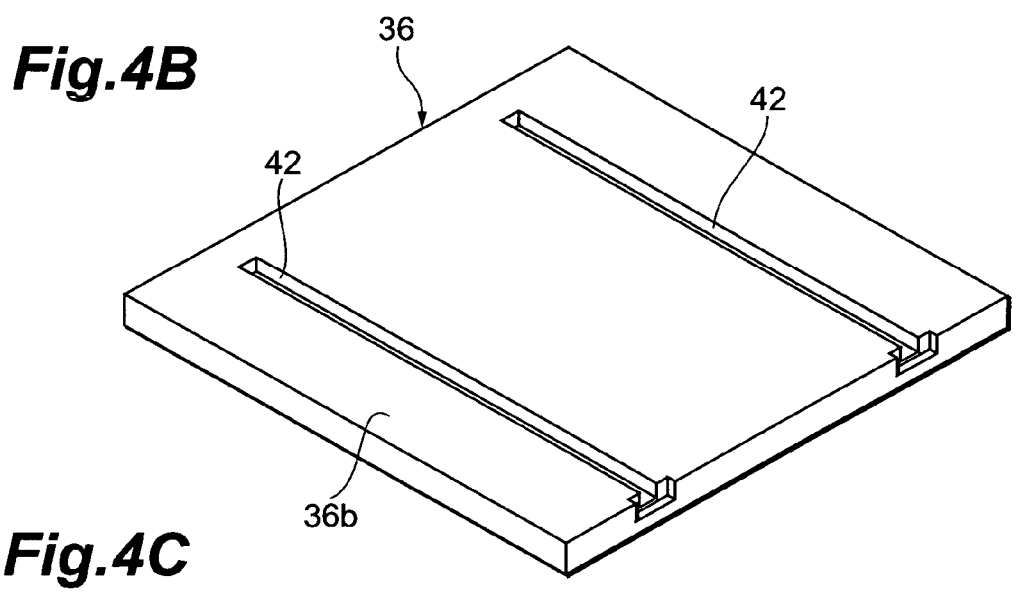
FIG. 4B is a perspective view showing the base body as seen from therebelow.
Figure 4C:
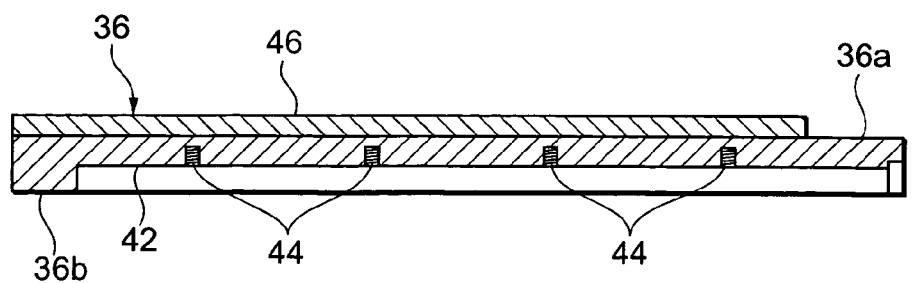
FIG. 4C is a sectional view taken along the line IVc—IVc of FIG. 4A.

As shown in FIGS. 2 and 3A, the wafer stage 34 comprises an X stage 84, a Y stage 86, and an electrostatic chuck 88. The X stage 84 is mounted on the stage base 32. The lower face of the X-stage 84 is provided with a pair of liners 90, each having an angular U-shaped cross section, which extend in the X direction and engage the pair of projections 46 on the stage base 32, respectively. The upper face of the X stage 84 is provided with a pair of projections 92 extending along the Y axis in FIG. 3A. The right side face of the X stage opposing a door 51 is provided with a connecting rod 94 extending along the X axis. By way of a through hole 96 penetrating through the door 51, the connecting rod 94 is detachably connected to a driving rod 156 of the sub-chamber 14, which will be explained later. Therefore, as the connecting rod 94 is pushed or pulled by the driving rod 156 along the X axis, the X stage 84 is positioned in the X direction while being guided by the pair of projections 46 on the stage base 32.

The Y stage 86 is mounted on the X stage 84. The lower face of the Y stage 86 is provided with a pair of liners 100, each having an angular U-shaped cross section, which extend along the Y axis and engage the pair of projections 92 on the X stage base 84, respectively. The lower face of the Y stage 86 is provided with an ultrasonic motor 104. A rod 102 extending along the Y axis is connected to the upper face of the X stage 84, whereas the ultrasonic motor 104 is displaced with respect to the rod 102 along the Y axis. As a consequence, the Y stage 86 is positioned in the Y direction while being guided by the pair of projections 92 on the X stage 84. The electrostatic chuck 88 is mounted on the upper face of the Y stage 86. Therefore, the semiconductor wafer W is positioned by the X stage 84 and Y stage 86 while in a state attracted to the electrostatic chuck 88. The wafer stage 34 may further comprise a finely movable stage for fine positioning on the order of several micrometers in X and Y directions.

Figure 3B:
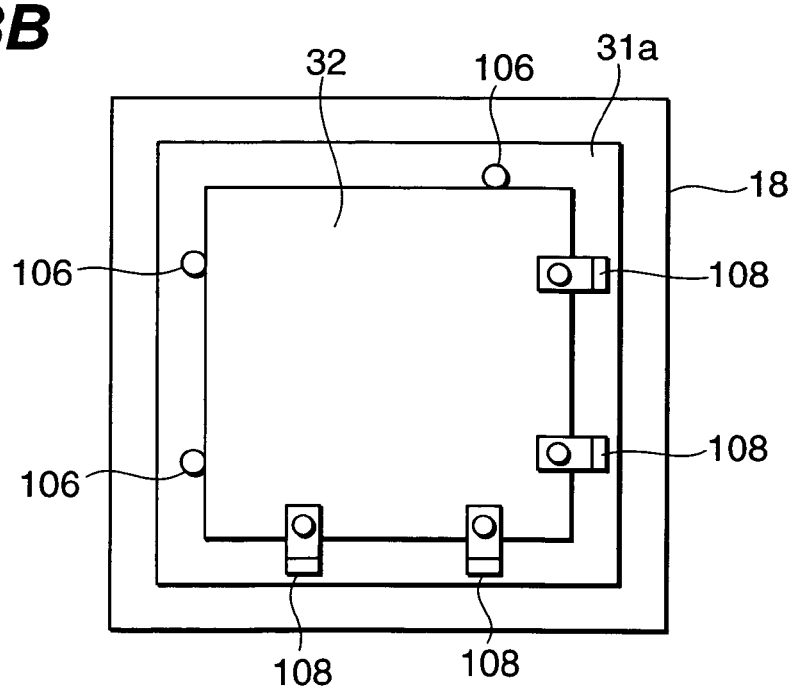
FIG. 3B is a plan view showing a state where the stage base is positioned with positioning pins and clamp members.

As shown in FIG. 3B, the stage base 32 mounted with the wafer stage 34 is positioned and fixed onto the bed 31 at the time of exposure processing. The positioning and fixing is effected by three positioning pins 106 and four clamp members 108. Two of the positioning pins 106 are disposed along the left wall part of the main chamber 12. The remaining positioning pin 106 is disposed along the rear wall part of the main chamber 12.

Figure 12:
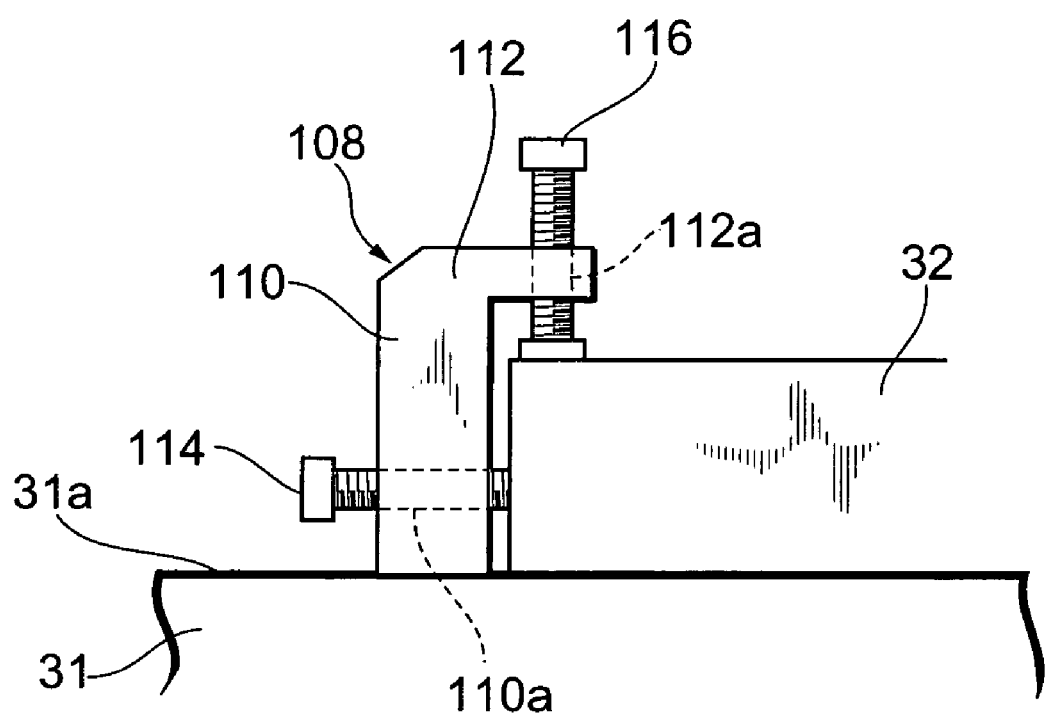
FIG. 12 is a view for explaining the clamping with a clamp member.

The four clamp members 108 are detachably attached onto the bed 31. As shown in FIGS. 3A and 12, each clamp member 108 is a substantially L-shaped member having an erect part 110 and a bent part 112. The erect part 110 is made slightly longer than the thickness of the stage base 32 and includes a screw hole 110a horizontally penetrating therethrough. The bent part 112 includes a screw hole 112a vertically penetrating therethrough. As shown in FIG. 3B, two clamp members 108 are detachably secured onto the bed 31 along the front wall part, whereas the remaining two clamp members 108 are secured onto the bed 31 along the right wall part. As shown in FIG. 12, a set screw 114 is inserted through the screw hole 110a formed in the erect part 110, so that the leading end of the set screw 114 pushes a side face of the stage base 32, whereby horizontal positioning with the positioning pin 106 is achieved firmly with precision. Also, a set screw 116 is inserted through the screw hole 112a formed in the bent part 112, so that the leading end of the set screw 116 pushes the upper face of the stage base 32, whereby vertical positioning with the bed 31 is achieved firmly with precision.

As shown in FIG. 2, the container body 18 accommodates a mask stage 64 for positioning and holding a mask M formed with a desirable pattern. The mask stage 64 carries out fine positioning in the rotational direction (θ direction) within the horizontal plane, vertical direction (hereinafter referred to as Z direction for the whole exposure apparatus 10), and inclination. The mask stage 64 is mounted on a reference base 166 rising from the bed 31 within the main chamber 12.

Also disposed within the container body 18 is a photodetector 168, such as a white light microscope, which irradiates the mask M and semiconductor wafer W with light and detects the light scattered by alignment marks which are not depicted. The photodetector 168 is mounted on the reference base 166. The data detected by the photodetector 168 is sent to and processed by an undepicted image processor mounted on the control console 16, whereby the positional relationship between the mask M and semiconductor wafer W is determined from the overlap between the alignment marks. When a positional deviation exists between the mask M and semiconductor wafer W, a signal for correcting the position of the mask M and/or semiconductor wafer W is generated, and the position of the mask M and/or semiconductor wafer W is minutely corrected according to this signal. Thus, precise positioning is effected between the mask M and semiconductor wafer W. In this embodiment, the mask M is disposed close to the semiconductor wafer W (with a gap on the order of 10 to 100 μm between the mask M and semiconductor wafer W).

The pressure in the inner space of the main chamber 12 is reduced by a vacuum pump which is not depicted. Under thus reduced pressure, the whole surface of the mask M is scanned with the electron beam emitted from the electron beam irradiating part 22, whereby the desirable pattern is transferred to a resist on the semiconductor wafer W with the magnification of 1:1.

As shown in FIGS. 1 and 2, the main chamber 12 is mounted on vibration-free tables 270 disposed under the bottom wall part 18a. The right wall part of the main chamber 12 is formed with an opening 126 which is provided with the door 51. Therefore, when the door 51 is opened, and the wafer stage 34 is horizontally slid (in the X direction in FIG. 3A) so as to be drawn out by way of the stage base 32, whereby the maintenance of the wafer stage 34 can be carried out on the outside of the main chamber 12.

Figure 13:
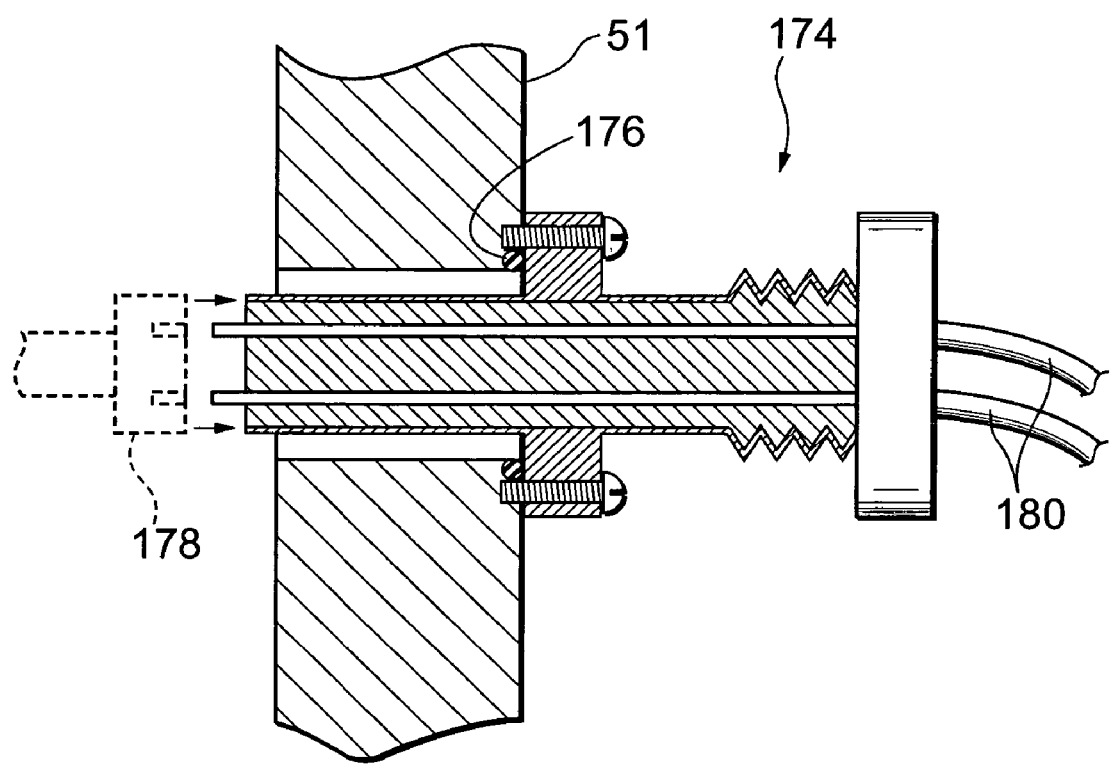
FIG. 13 is a sectional view showing the configuration of a terminal for introducing a current into the main chamber.

As shown in FIG. 1, the door 51 is attached to the container body 18 with hinges 172 so as to be able to open and close. Terminals 174 for introducing a current into the main chamber 12 are disposed near the hinges 172 of the door 51. Here, "disposed near the hinges 172 of the door 51" means that the terminals 174 are disposed at least closer to the hinges 172 than the center of the door 51 in terms of the Y axis. As shown in FIG. 13, each terminal 174 is airtightly attached to the door 51 by way of an O-ring 176, so as to connect with a connector 178 within the main chamber 12. As a consequence, various devices accommodated in the main chamber 12 are driven. As shown in FIG. 1, cables 180 extend from the terminals 174 to the control console 16.

As shown in FIGS. 1 and 2, on the outside of the main chamber 12, the sub-chamber 14 is disposed at a position opposing the door 51. The sub-chamber 14 comprises a driving rod 156 extending along the X axis, a driving source for displacing the driving rod 156 along the X axis, and a housing 80 for accommodating the driving rod 156 and driving source. The driving source comprises a screw rod 82 whose surface is spirally inscribed with a thread, and a motor 83 for rotating the screw rod 82 about its axis. The screw rod 82 extends along the X axis. The screw rod 82 is inserted through a tubular member 85, whereas the screw inscribed on the inner face of the tubular member 85 is in mesh with the screw inscribed on the surface of the screw rod 82.

The tubular member 85 is connected to the base end of the driving rod 156. The bottom part of the tubular member 85 is fitted into a liner 87 having an upper face formed with a groove extending along the X axis, so that the tubular member 85 is guided along the X direction while being restrained from rotating. Therefore, when the screw rod 82 rotates as the motor 83 revolves, the tubular member 85 moves along the X axis, whereby the driving rod 156 shifts along the X axis. As the driving rod 156 shifts, the X stage 84 (with the Y stage 86 mounted thereto) is positioned in the X direction by way of the connecting rod 94.

The bottom face of the housing 80 of the sub-chamber 14 is provided with two pairs of wheels 190. The sub-chamber 14 is mounted on and supported by a support table 192 attached to a lower part of the right side wall of the main chamber 12. Disposed between the sub-chamber 14 and the door 51 of the main chamber 12 is a bellows 95 which airtightly closes the space between the sub-chamber 14 and main chamber 12. One end of the bellows 95 is airtightly attached to the surroundings of the through hole 51 through which the connecting rod 94 and driving rod 156 are inserted, whereas the other end is airtightly connected to the front face of housing 80 of the sub-chamber 14 through which the driving rod 156 is inserted, so as to cover the junction between the driving rod 156 and connecting rod 94. As a consequence, the main chamber 12 and sub-chamber 14 are vacuumed by an undepicted vacuum pump, whereby an environment with reduced pressure is realized.

Figure 14:
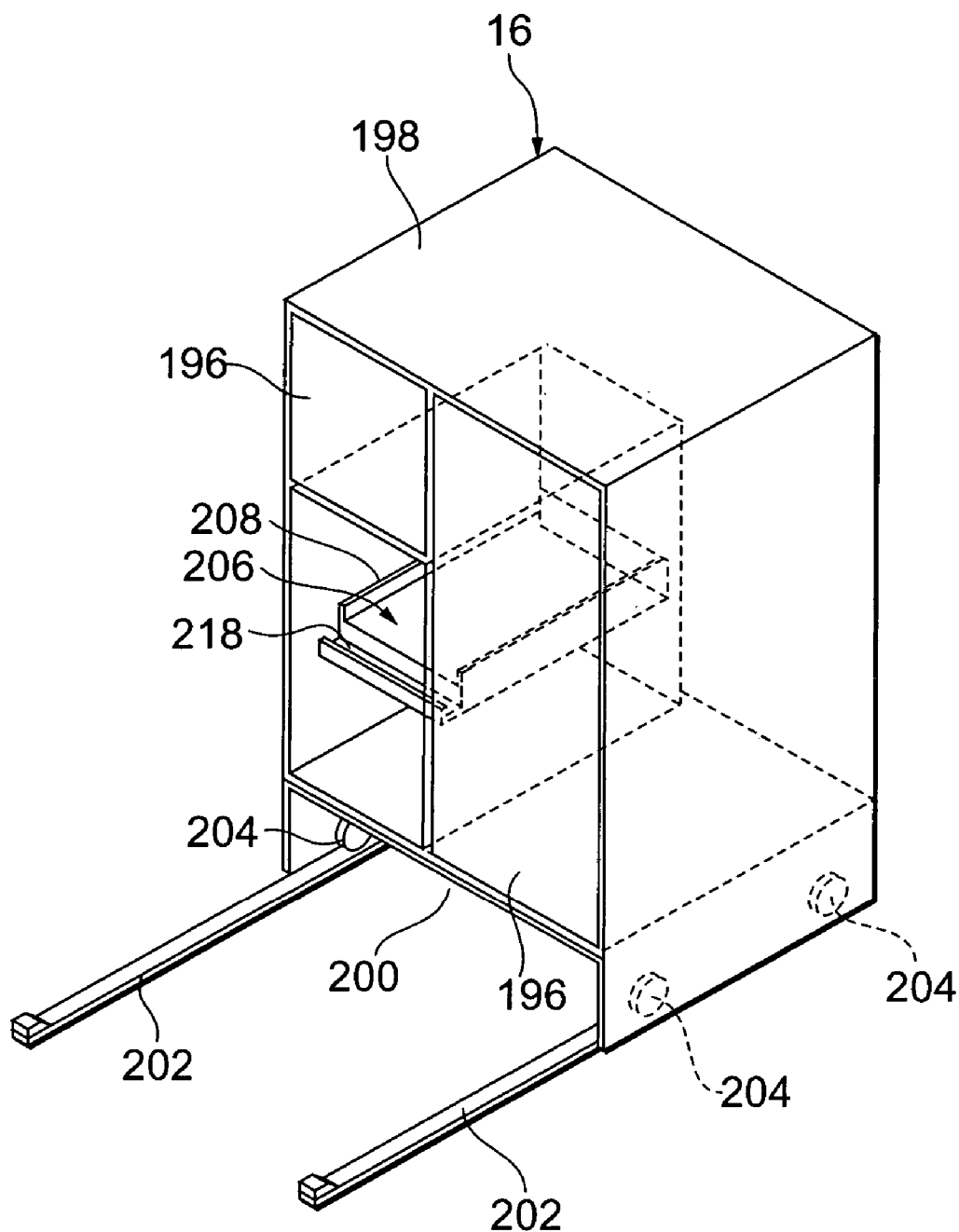
FIG. 14 is a perspective view showing the configuration of the control console.

As shown in FIGS. 1 and 14, the control console 16 is disposed so as to oppose the right wall part of the main chamber 12 where the door 51 is provided. The control console 16 includes various control units 196 for carrying out control operations such as the positioning of the semiconductor wafer W and mask M, image processing for exposure correction, and the like which are required when exposing the semiconductor wafer W to the electron beam within the main chamber 12, whereas these control units 196 are accommodated in a housing 198 having a rectangular parallelepiped outer shape. The lower part of the housing 198 is made hollow so as to form a space 200, which can accommodate the surplus of cables 180 extending from the terminals 174 of the main chamber 12 to the control console 16.

The control console 16 is movable along the drawing direction of the wafer stage 34 (X axis in FIG. 3A). Namely, the control console 16 is movable between a normal operating position (see FIG. 15) adjacent the right wall part of the main chamber 12 and a maintenance position (see FIG. 1) separated from the main chamber 12 by a predetermined distance along the X axis while being guided by a pair of rails 202.

The pair of rails 202 are placed in parallel with each other between the normal operating position and the maintenance position. The control console 16 is movable along the X axis while being guided on the pair of rails 202 by way of wheels 204 attached to the lower part of the housing 198.

Figure 15:
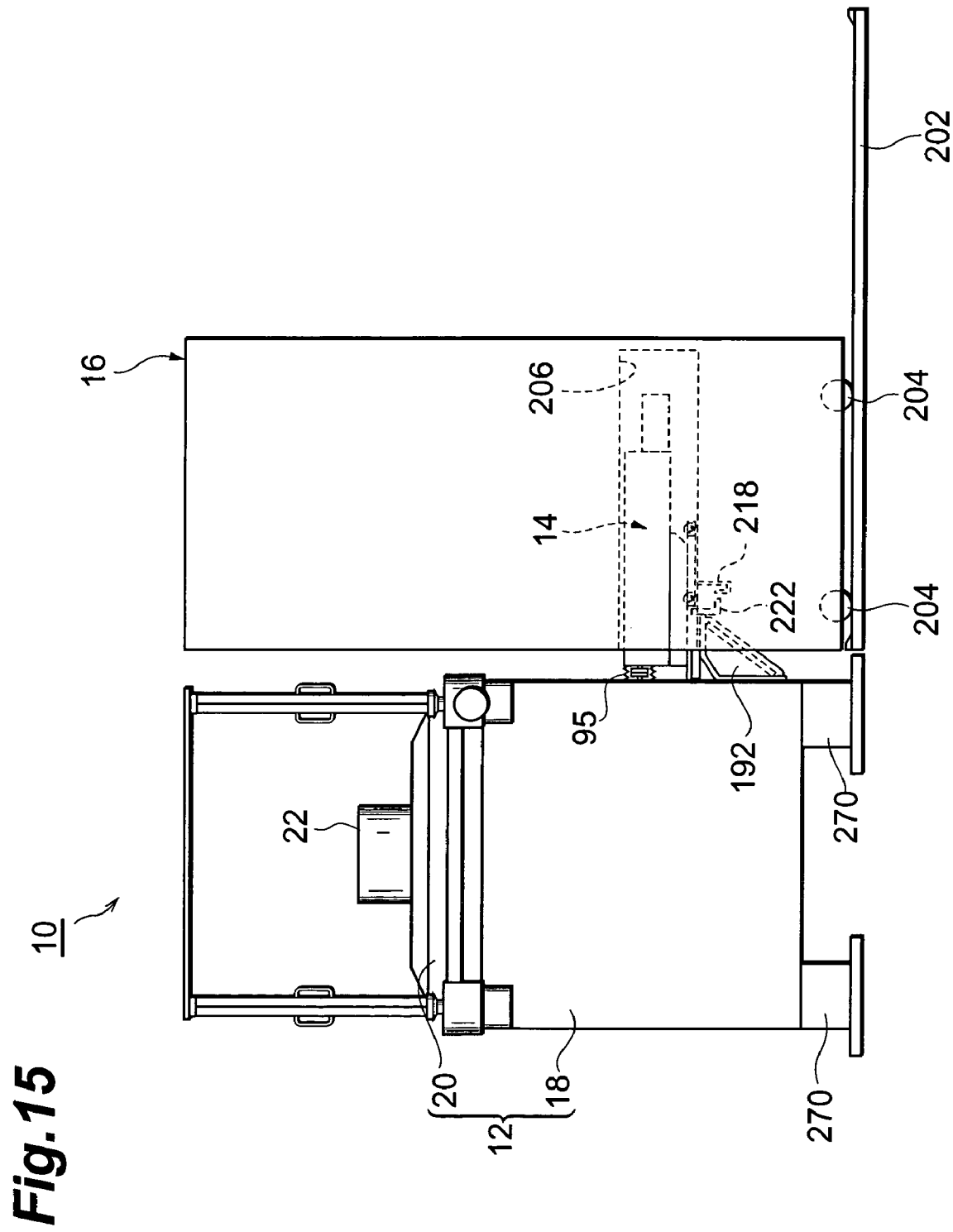
FIG. 15 is a front view showing the configuration of the electron beam exposure apparatus in accordance with the embodiment (in a state where the control console is located at a normal operating position)

As shown in FIG. 14, a container 206 which can accommodate the sub-chamber 14 is disposed substantially on a level with the sub-chamber 14 by using a partial space within the housing 198 of the control console 16. The container 206 includes a mounting surface on which the sub-chamber 14 is mounted, whereas ribs 208 for positioning the sub-chamber 14 are provided at side edges of the mounting surface. The container 206 can accommodate at least a part of the sub-chamber 14 when the control console 16 is located at the normal operating position as shown in FIG. 15.

Figure 16:
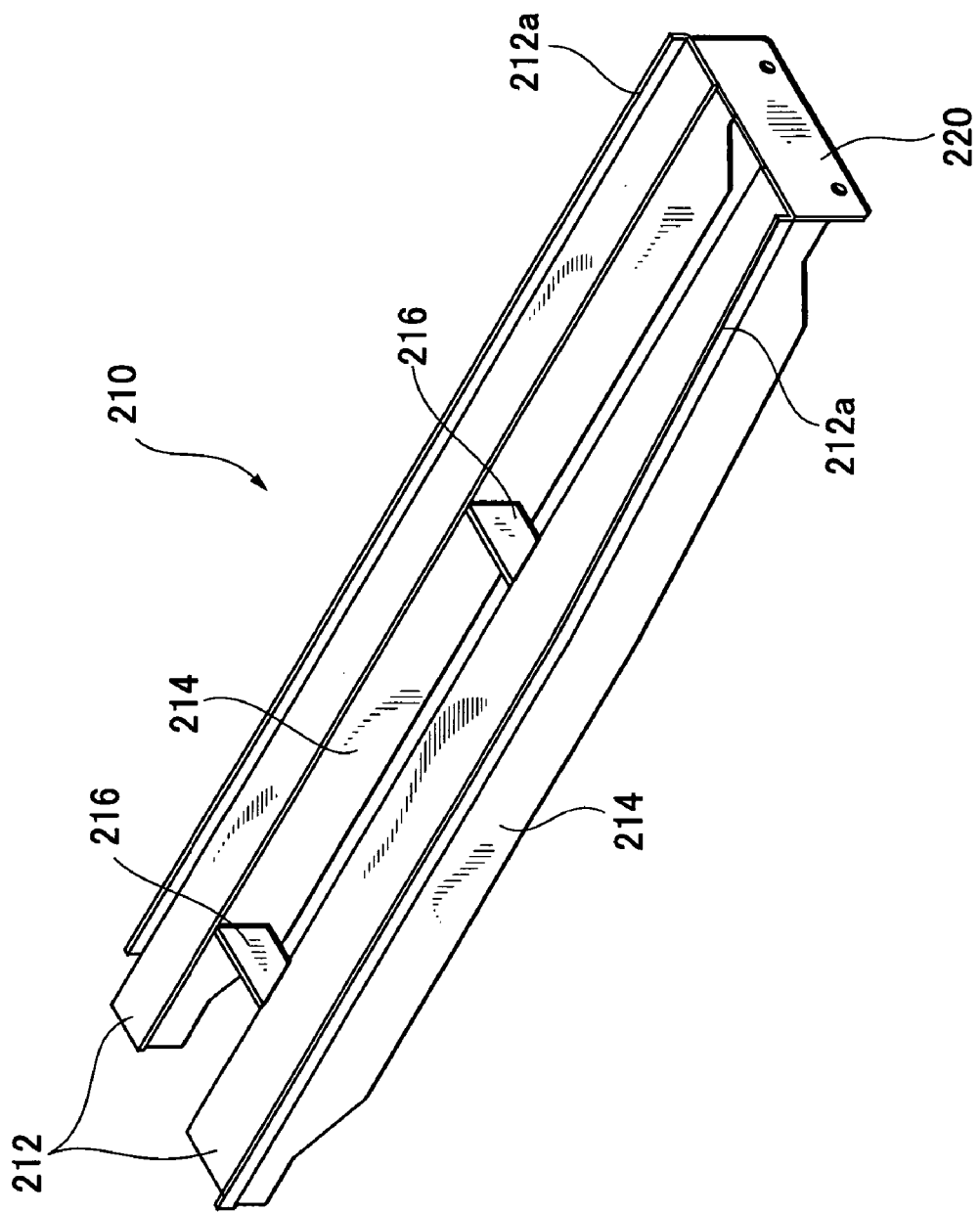
FIG. 16 is a perspective view showing the configuration of a guide rail.

As shown in FIG. 16, the exposure apparatus 10 in accordance with this embodiment comprises a guide rail (guide mechanism) 210 which bridges the main chamber 12 and the container 206 of the control console 16 in a detachable fashion. The guide rail 210 comprises a pair of rails 212 each having an L-shaped cross section, a pair of ribs 214 disposed at the respective bottom faces of the rails 212, and connecting ribs 216 linking the pair of ribs 214 to each other, thereby connecting the pair of rails 212 together. The pair of rails 212 are connected to each other in conformity to the gap between the wheels 190 provided at the bottom face of the sub-chamber 14, so that the wheels 190 of the sub-chamber 14 rotate and move on the rails 212. Here, bent parts 212a of the rails 212 prevent the sub-chamber 14 from falling sideways.

Figure 17:
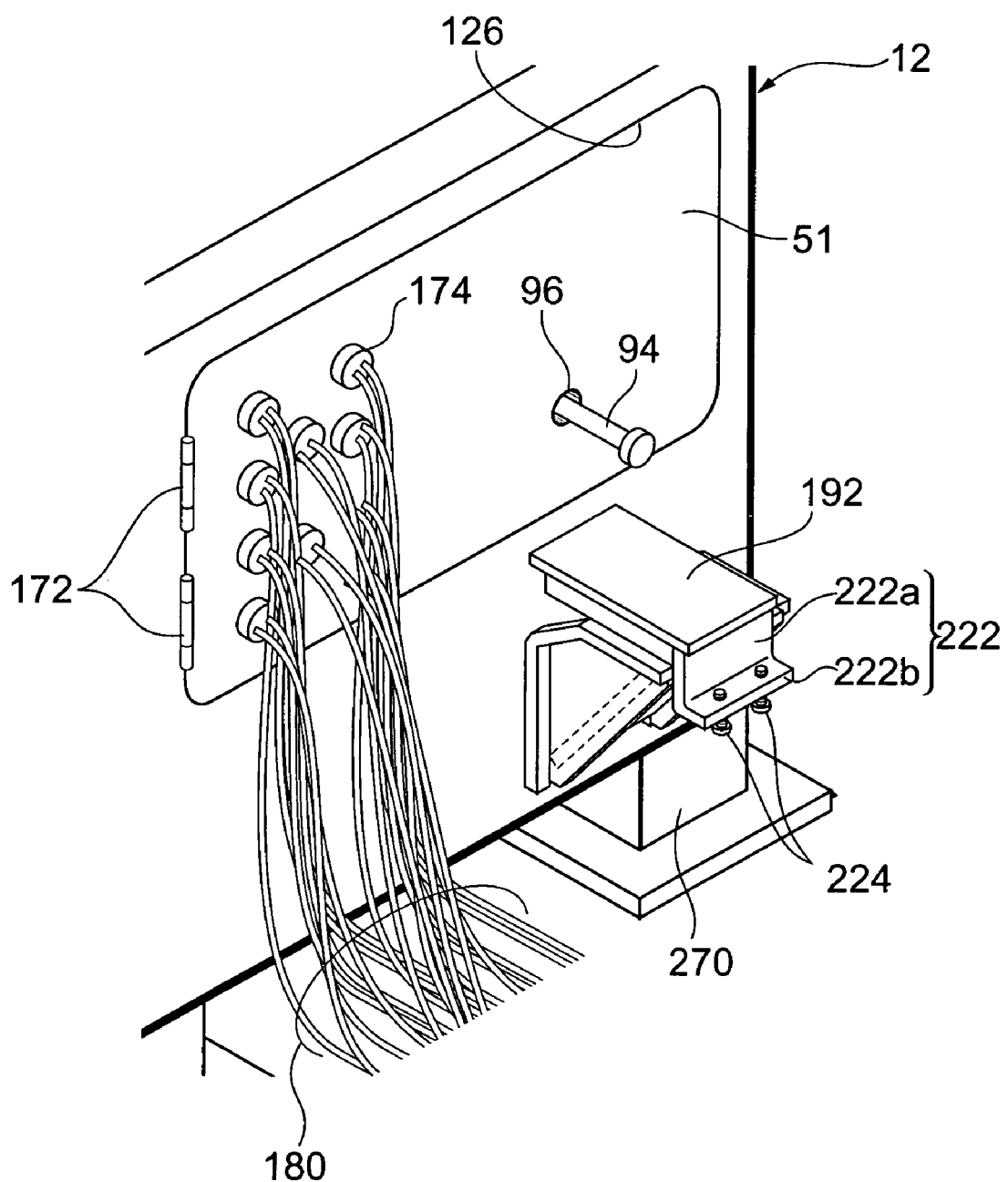
FIG. 17 is a perspective view showing the configuration of a support table for supporting the sub-chamber and a rail receiver for receiving an end of the guide rail.
Figure 18:
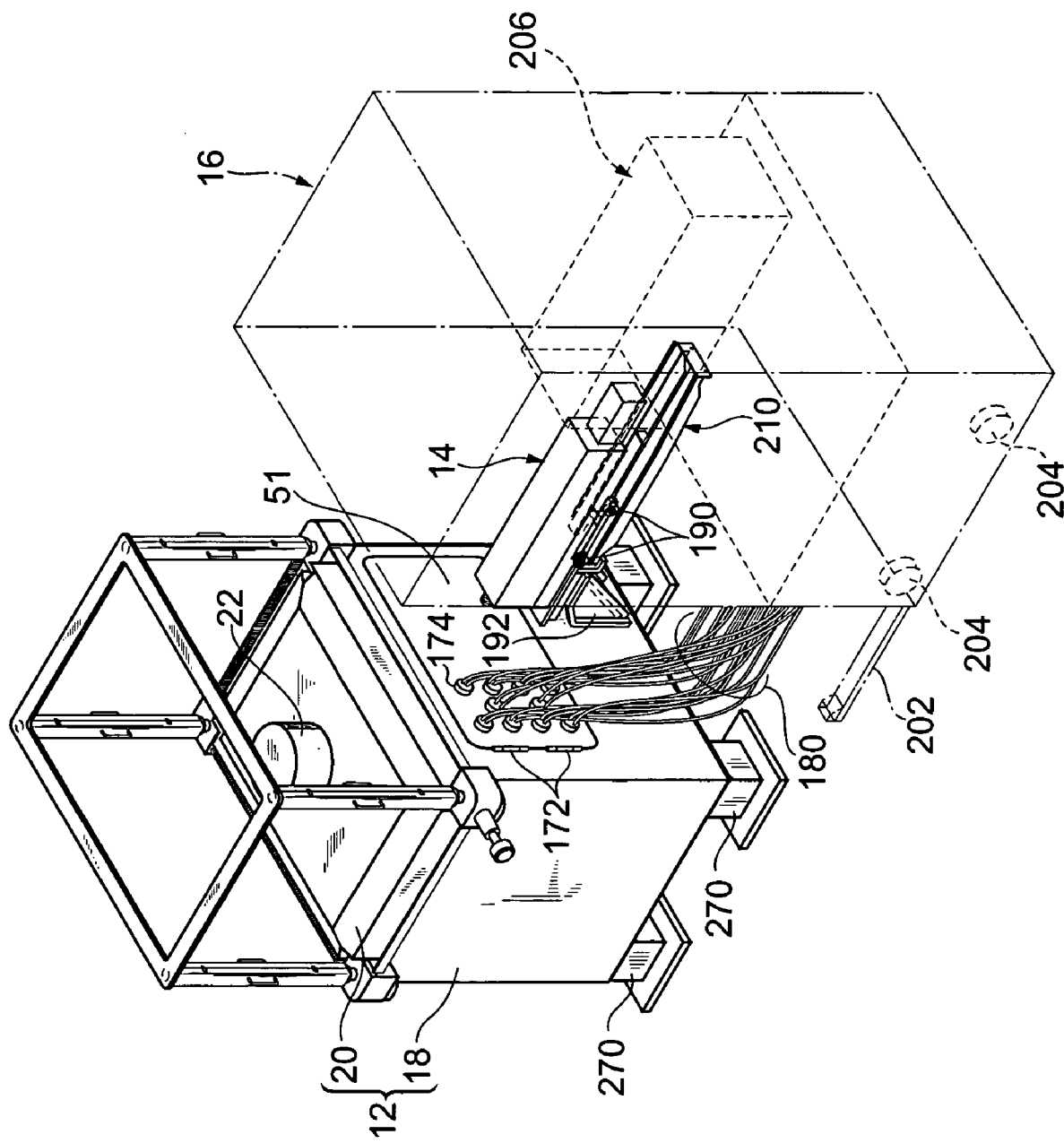
FIG. 18 is a perspective view showing a state where the guide rail bridges the main chamber and a container of the control console.

One end of the guide rail 210 is provided with a latch 220 adapted to engage a rail receiver 218 of the container 206 provided with the control console 16. The latch 220 is constituted by a plate connecting the pair of rails 212 to each other. The latch 220 fits into the rail receiver 218 including a recess with an angular U-shaped cross section disposed at the front face of the container 206 as shown in FIG. 14. The other end of the guide rail 210 is mounted on a rail receiver 222 having an L-shaped cross section disposed at the front face of the support table 192 of the main chamber 12 as shown in FIG. 17. The rail receiver 222 includes a board part 222a and a bent part 222b. The board part 222a is secured to the front face of the support table 192 such that the board surface extends vertically, whereas the bent part 222b receives the guide rail 210. Thus, as shown in FIGS. 18 and 19, the guide rail 210 bridges the main chamber 12 and the container 206 of the control console 16.

Figure 19:
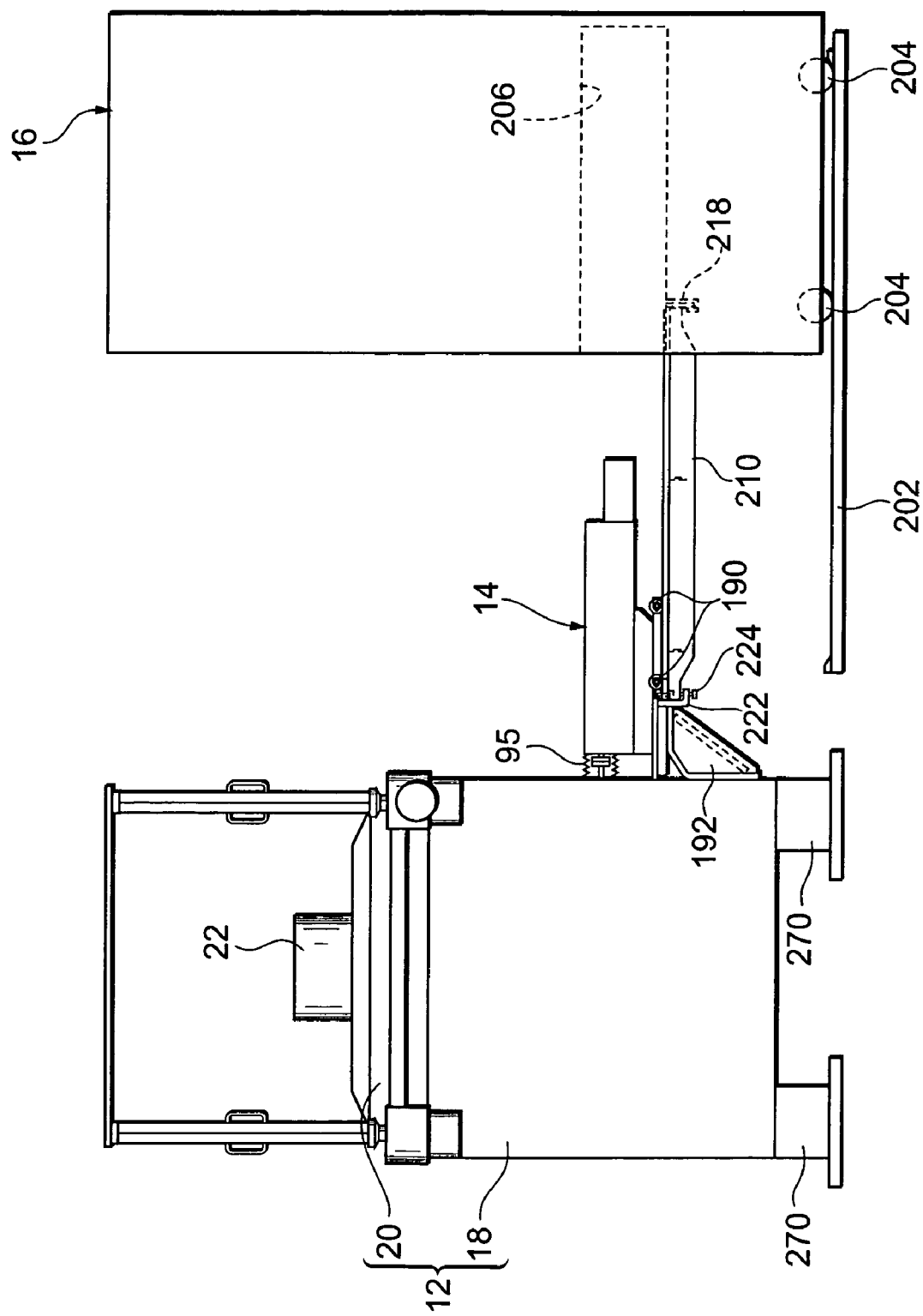
FIG. 19 is a front view showing a state where the guide rail bridges the main chamber and the container of the control console.

As shown in FIGS. 17 and 19, the bent part 222b of the rail receiver 222 on the main chamber 12 side is provided with a pair of screw holes in mesh with respective bolts 224. Each bolt 224 can adjust the height by which it projects vertically from the upper face of the bent part 222b by rotation. Ascending the bolts 224 (inclination adjusting means) by rotation can elevate the guide rail 210 by way of the pair of rails 212 in contact with the upper ends of the bolts 224, and thus can adjust the inclination of the guide rail 210 between the main chamber 12 and the container 206 of the control console 16.

Figure 20:
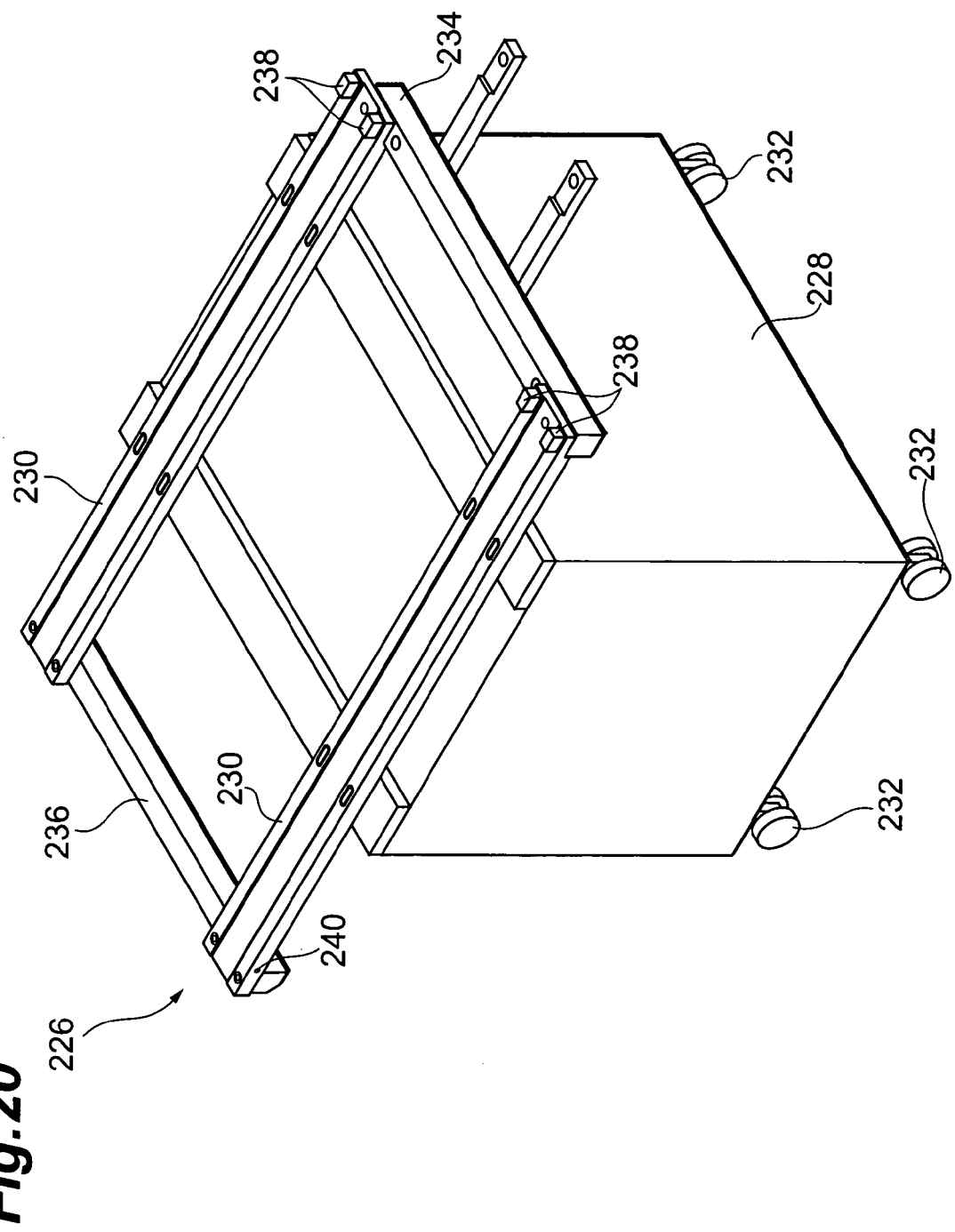
FIG. 20 is a perspective view showing a trestle for mounting the wafer stage.

As shown in FIG. 20, the exposure apparatus 10 in accordance with this embodiment also comprises a trestle 226 which can be placed between the main chamber 12 and the control console 16. The trestle 226 comprises a support 228 and a pair of rails 230. The bottom face of the support 228 is provided with wheels 232, so as to be easily movable on the installation surface. The pair of rails 230 are disposed in parallel with each other on the upper face of the support 228. The distance between the pair of rails 230 is set in conformity to the gap between the wheels 40 attached to the lower face of the stage base 32. The longitudinal length of the pair of rails 230 is longer than that of the support 228, whereby both end parts of the rails 230 project from their corresponding side walls of the support 228. The upper faces of the pair of rails 230 are provided with grooves for guiding the wheels 40 attached to the lower face of the stage base 32.

A bracket 234 to connect with the sub-chamber 14 accommodated in the container 206 is disposed at one end of the pair of rails 230. A bracket 236 to connect with the main chamber 12 is disposed at the other end of the pair of rails 230. The positioning of the trestle 226 using the brackets 234, 236 will be explained later.

The upper face of the end part on the side provided with the bracket 234 in the pair of rails 230 is formed with protrusions 238 for positioning the stage base 32 mounted on the trestle 226 after being guided with the pair of rails 230. Side faces of the end part on the side provided with the bracket 236 in the pair of rails 230 are formed with screw holes 240. The positioning of the stage base 32 using the protrusions 238 and screw holes 240 will be explained later.

Figure 21:
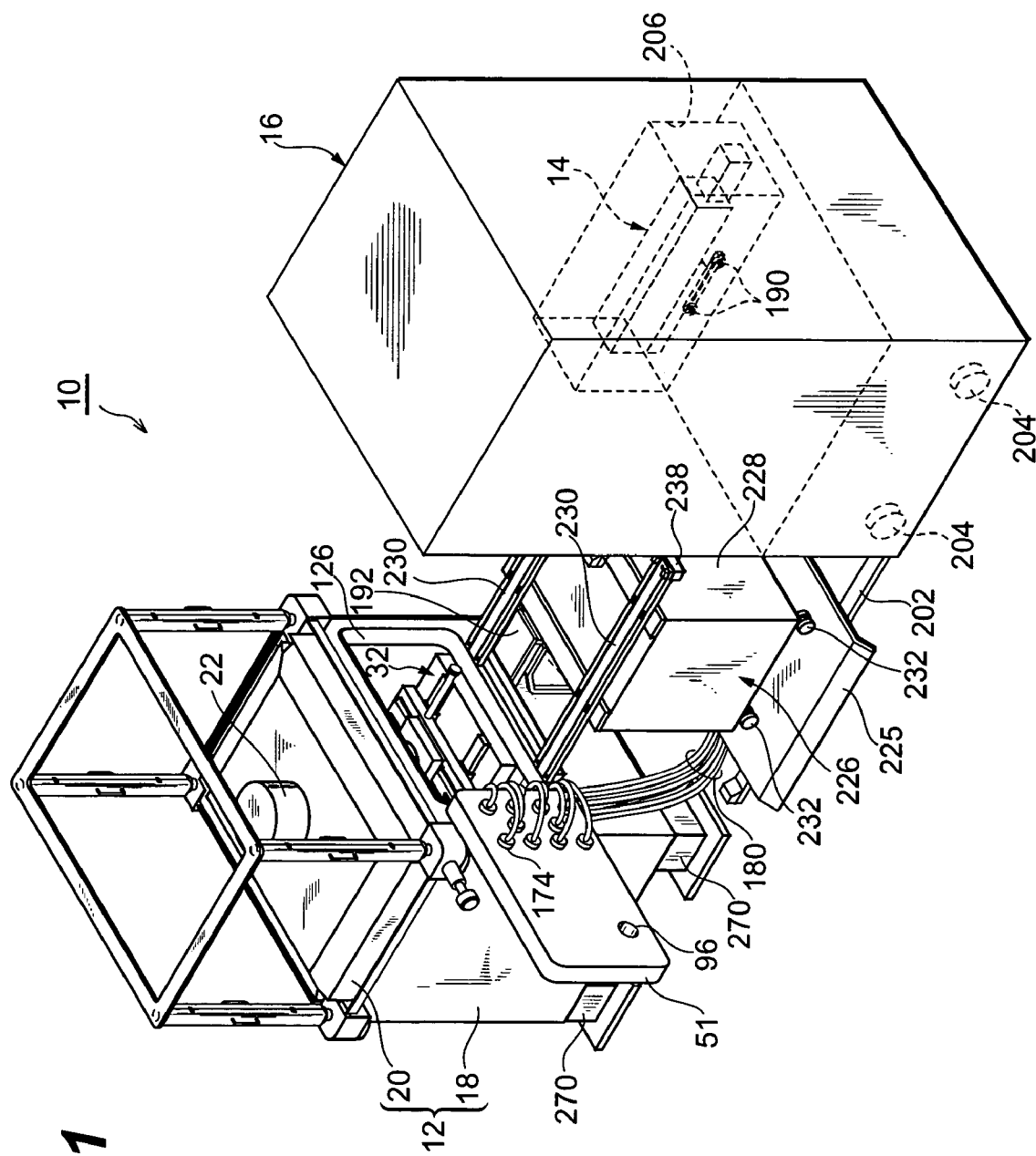
FIG. 21 is a perspective view showing a state where the trestle is placed between the main chamber and the control console.
Figure 22:
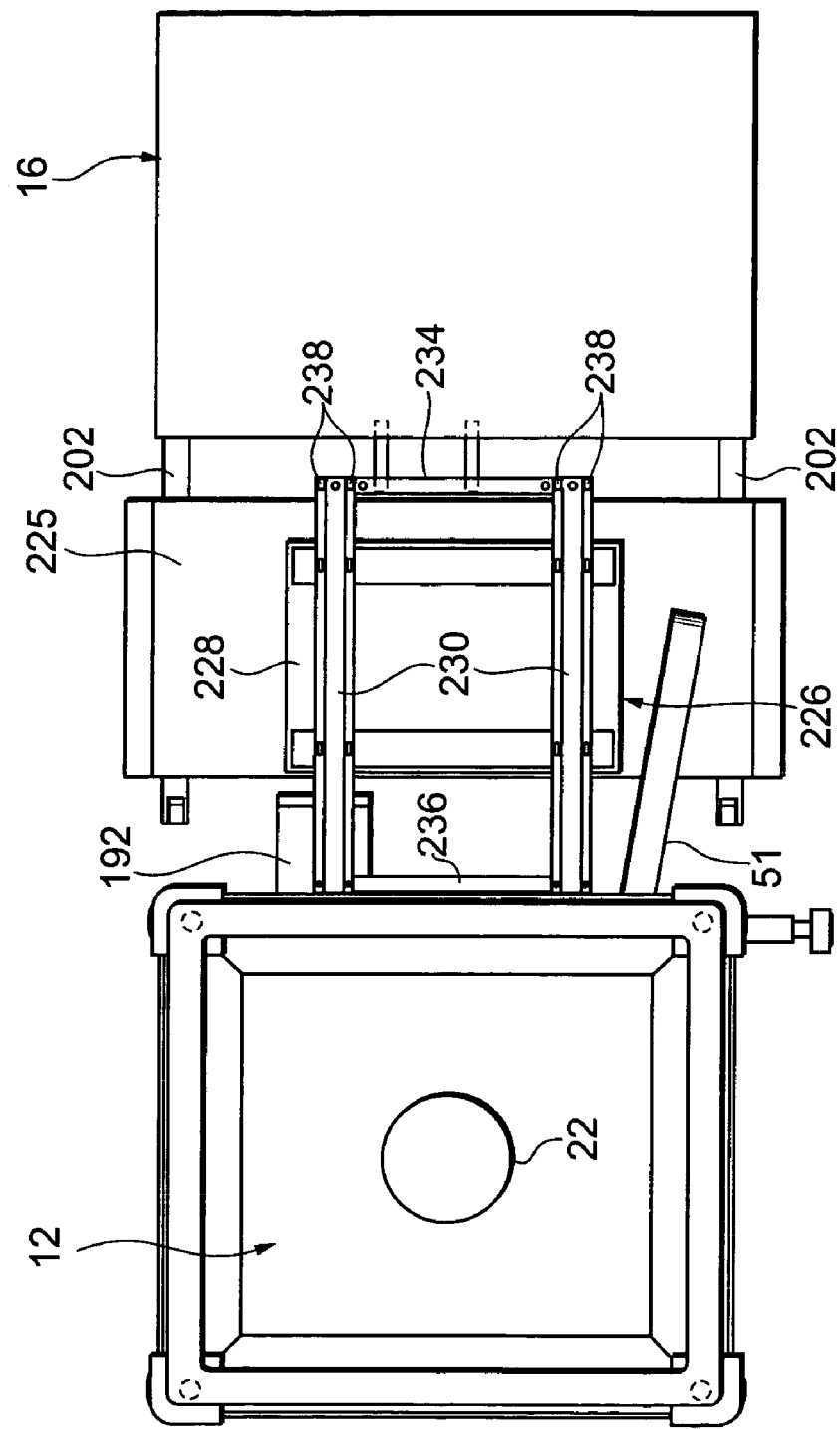
FIG. 22 is a plan view showing the state where the trestle is placed between the main chamber and the control console.
Figure 23:
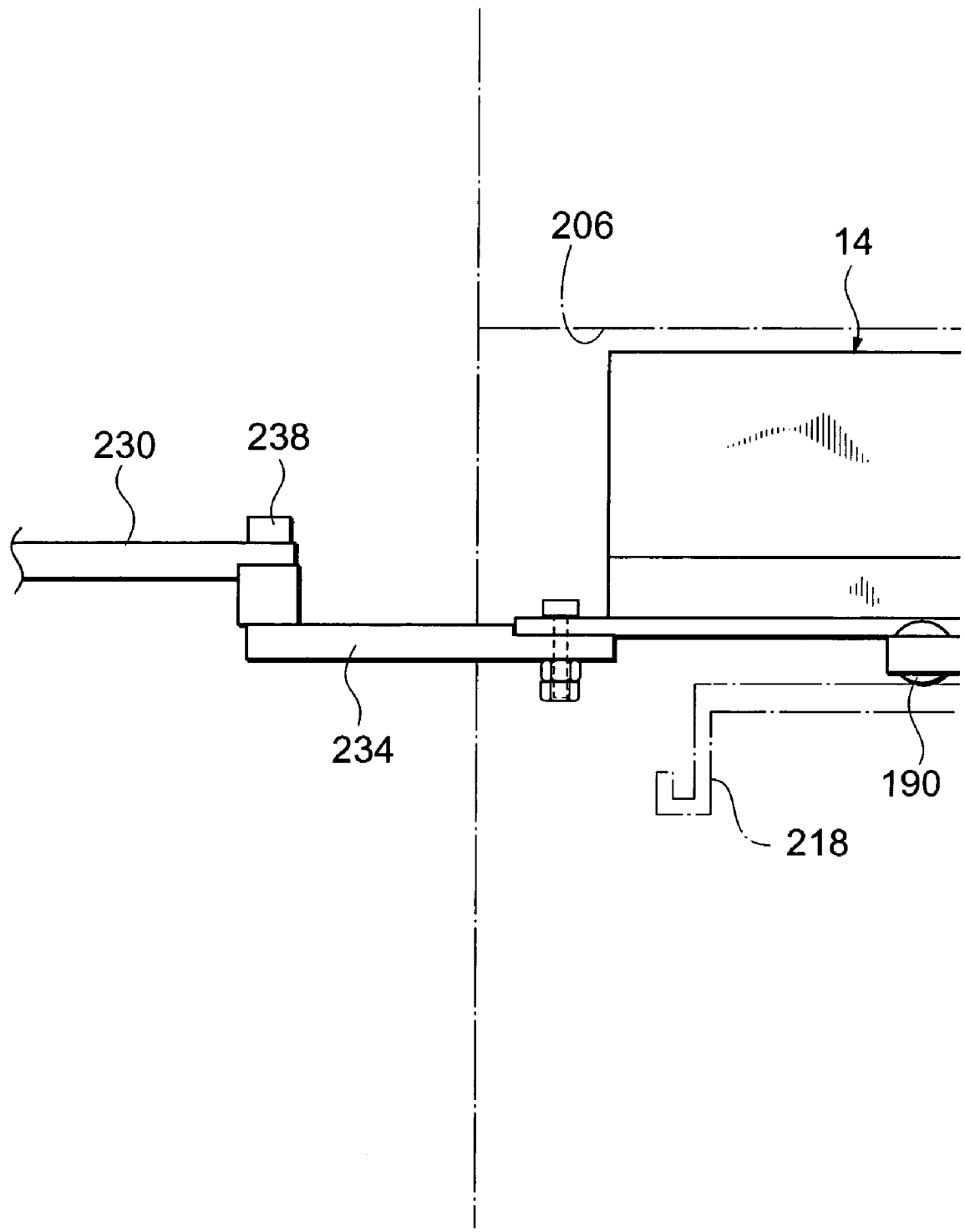
FIG. 23 is an enlarged view showing a state where a bracket attached to an end of a rail on the trestle and the sub-chamber are connected to each other.
Figure 24:
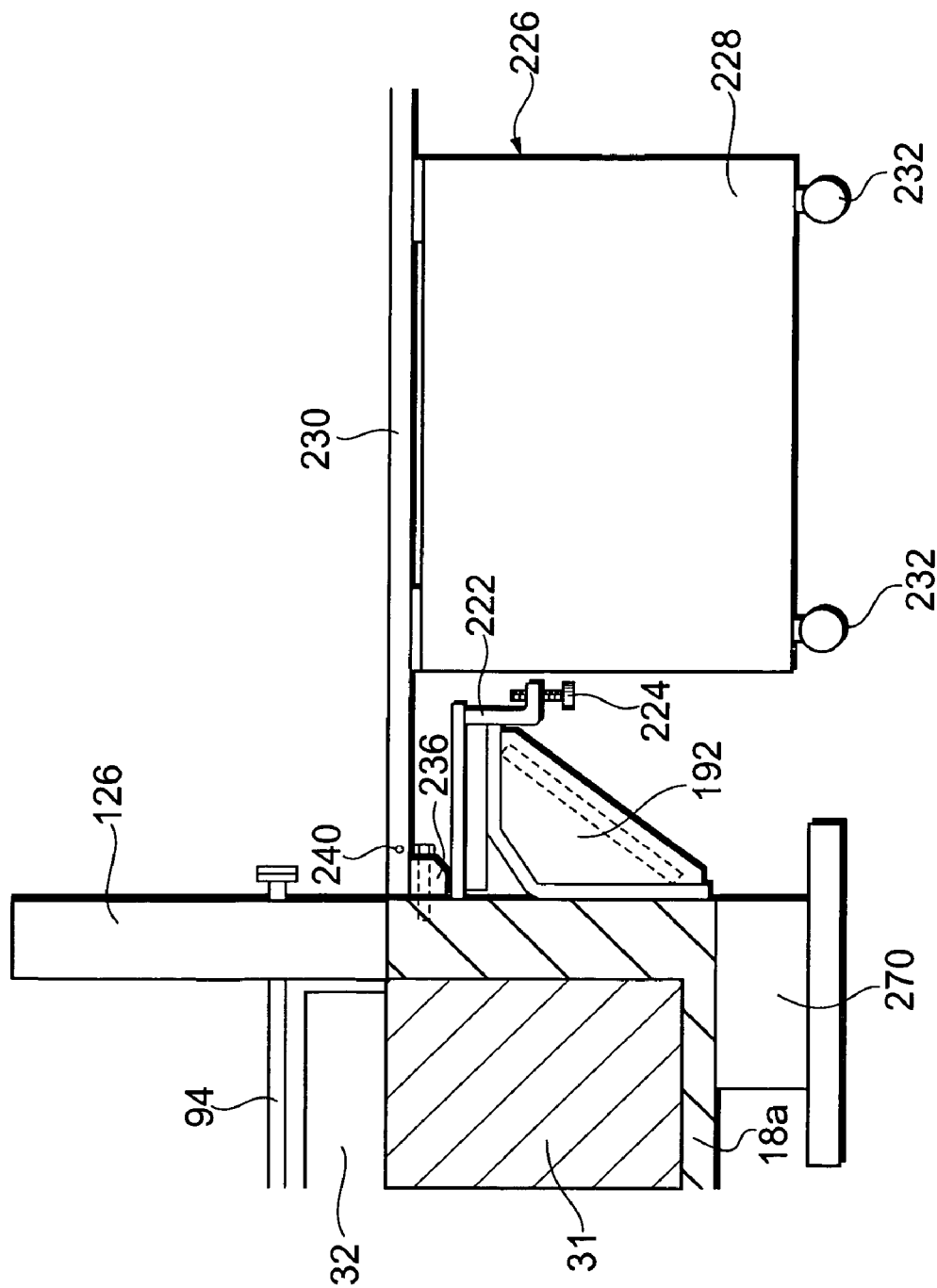
FIG. 24 is an enlarged view showing a state where a bracket attached to the other end of the rail on the trestle and the main chamber are connected to each other.

As shown in FIGS. 21 and 22, the trestle 226 is placed between the main chamber 12 and control console 16 at the time of maintenance. Here, as shown in FIG. 23, the bracket 234 is connected to the sub-chamber 14 accommodated in and positioned by the container 206 of the control console 16. As shown in FIG. 24, the bracket 236 is connected to the right wall part of the main chamber 12. As such, the trestle 226 is positioned between the main chamber 12 and the control console 16. Here, the end part of the pair of rails 230 on the main chamber 12 side is substantially on a level with the upper face 31a of the bed 31 in the main chamber 12 on which the stage base 32 is mounted. This can smoothly move the stage base 32 to the pair of rails 230.

Figure 25:
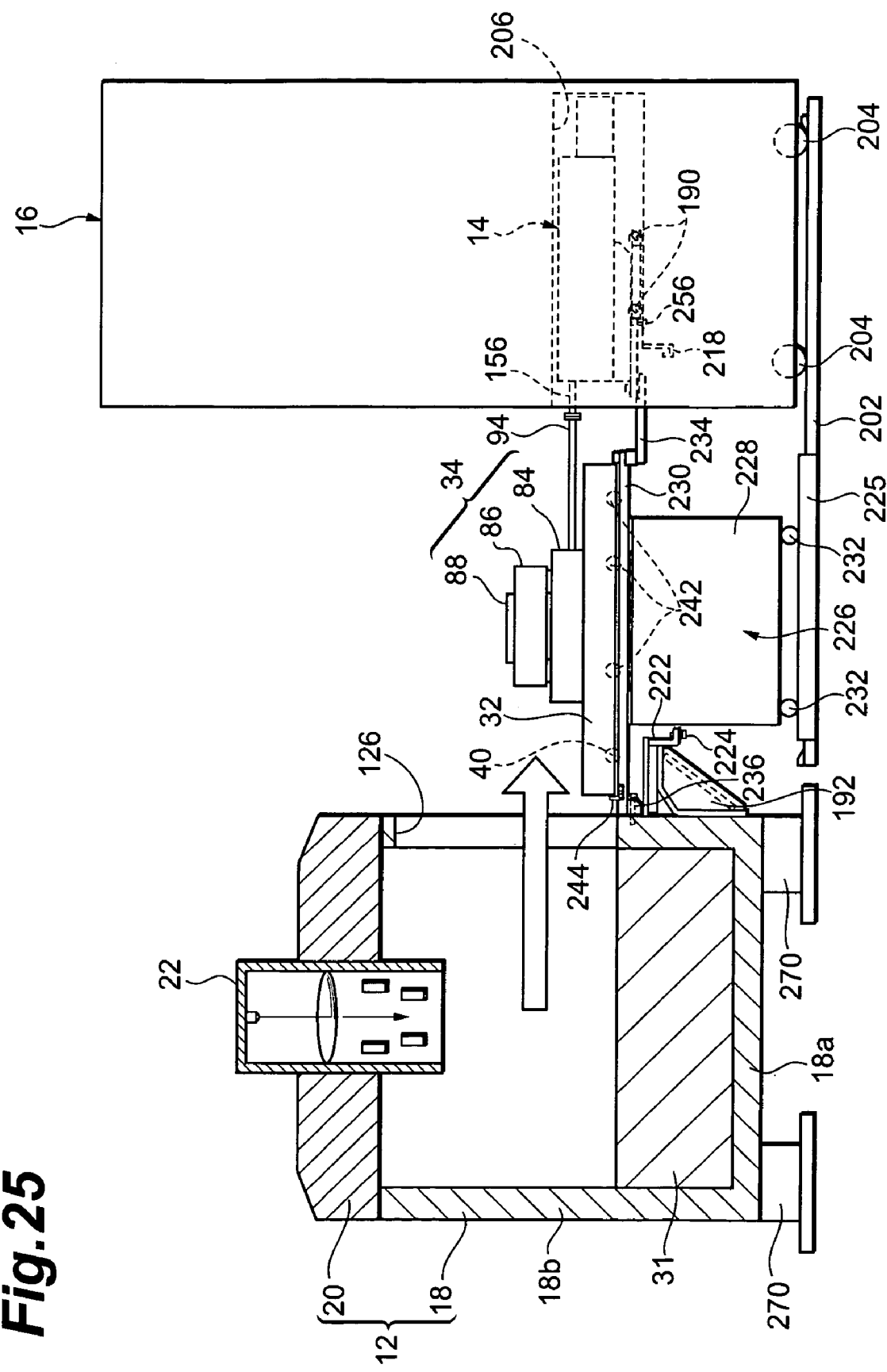
FIG. 25 is a front view showing a state where the wafer stage is drawn out and mounted on the trestle.

As mentioned above, the lower face of the stage base 32 is provided with the wheels 40, whereby the stage base 32 can be drawn onto the trestle 226 while being guided on the pair of rails 230 by way of the wheels 40 as shown in FIG. 25. The stage base 32 drawn onto the trestle 226 can be positioned such that its movement along the X axis is restricted by the right wall in contact with the protrusions 238 and the left wall in contact with a stopper 244 as shown in FIG. 25.

Figure 26:
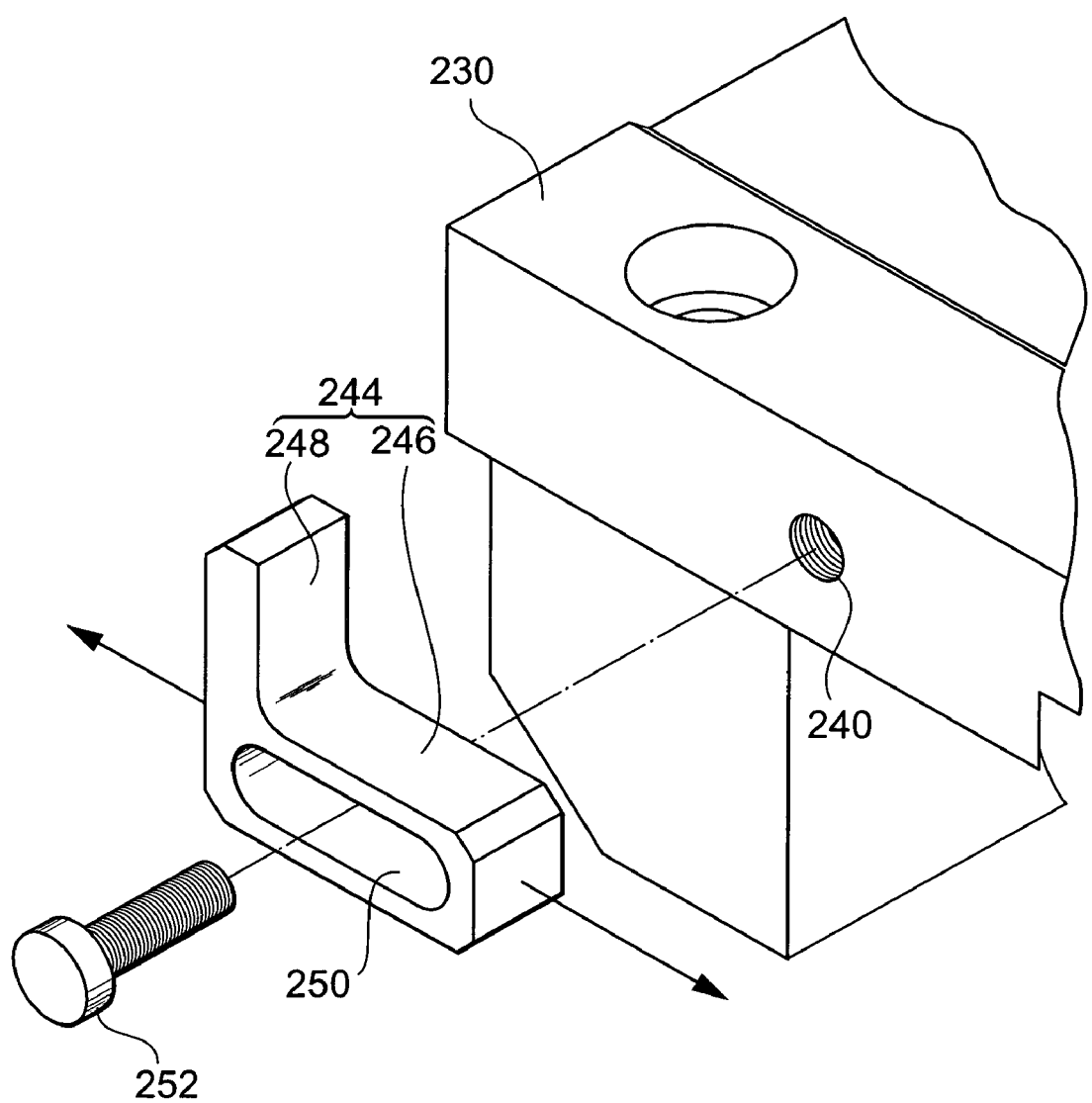
FIG. 26 is a perspective view showing a state where a stopper is secured to a screw hole in the rail by way of a bolt.

As shown in FIG. 26, the stopper 244 is an L-shaped member having a base 246 and an abutment 248. An elongated hole 250 penetrates through the base 246 of the stopper 244. When a male screw 252 meshes with the screw hole 240 through the elongated hole 250 in the side face of the end part on the side provided with the bracket 236 in the pair of rails 230, the stopper 244 is secured to the side face of the rails 230. Here, as indicated by arrows in FIG. 26, the position of the stopper 244 can finely be adjusted along the X axis by the elongated hole 250, whereby the abutment 248 can reliably be brought into contact with the left wall of the stage base 32. Thus, the X-directional movement of the stage base 32 mounted on the trestle 226 is restricted.

As shown in FIG. 25, in the state where the stage base 32 is mounted on the trestle 226, the connecting rod 94 can connect with the driving rod 156 of the sub-chamber 14 accommodated in the container 206 of the control console 16.

Figure 27:
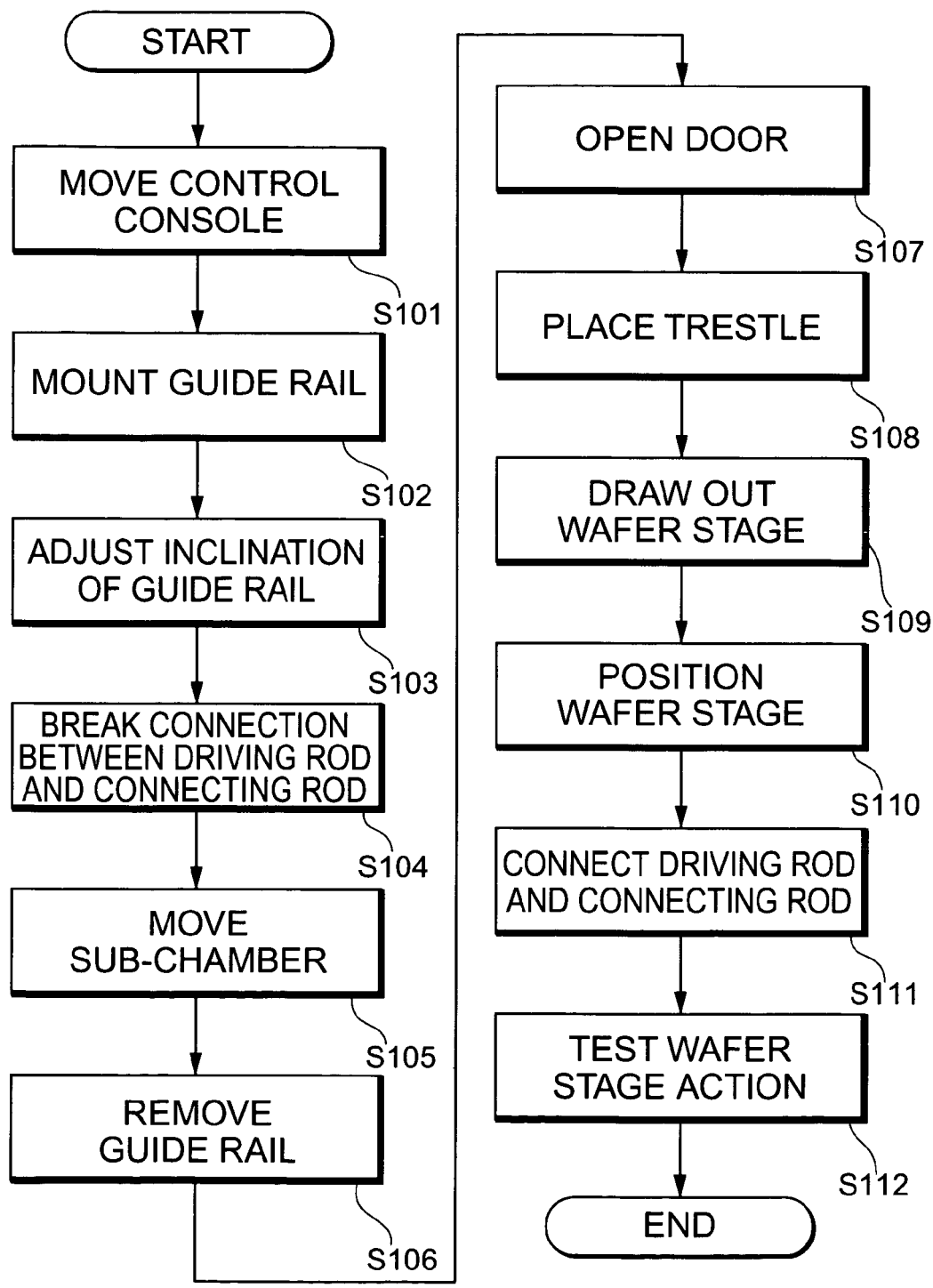
FIG. 27 is a flowchart showing the flow of the maintenance method for an exposure apparatus in accordance with an embodiment.

With reference to the flowchart shown in FIG. 27, a maintenance method for thus configured exposure apparatus 10 will now be explained.

At the time of normal operation (exposure processing), the sub-chamber 14 is disposed at a position opposing the door 51 on the outside of the main chamber 12 while in a state mounted on and supported by the support table 192 as shown in FIGS. 1 and 2. The driving rod 156 is connected to the connecting rod 94 of the wafer stage 34 by way of the through hole 96 of the door 51. The bellows 95 is disposed between the sub-chamber 14 and the door 51 of the main chamber 12, whereby the space between the sub-chamber 14 and the main chamber 12 is airtightly closed. As shown in FIG. 15, the control console 16 is disposed at the normal operating position adjacent the right wall part of the main chamber 12. Here, the sub-chamber 14 is partly accommodated in the container 206 of the control console 16.

In this state, the semiconductor wafer W is supplied into the container body 18 and attracted onto the electrostatic chuck 88 as shown in FIG. 2. Also, the mask M is supplied into the container body 18 and is held on the mask stage 64. Then, the mask M and the semiconductor wafer W are positioned with respect to each other. According to a signal detected by the photodetector 168, the control units 196 in the control console 16 determine the positional relationship between the mask M and semiconductor wafer W, and the positioning between the mask M and semiconductor wafer W is carried out according to a signal correcting their positions which is sent to the main chamber 12 by way of the cables 180.

Here, the positioning of the semiconductor wafer W is carried out in the following manner. Namely, when the screw rod 82 rotates as the motor 83 of the sub-chamber 14 revolves, the tubular member 85 is guided along the X axis by the liner 87, whereby the driving rod 156 is displaced along the X axis as shown in FIGS. 2, 3A, and 3B. When the driving rod 156 is displaced along the X axis, the connecting rod 94 connected thereto is pushed or pulled along the X axis. This positions the X stage 84 (and the Y stage 86 mounted thereon) along the X axis. On the other hand, the rod 102 is pushed or pulled along the Y axis by the ultrasonic motor 104. This positions the Y stage 86 along the Y axis. Thus, the semiconductor wafer W is positioned in the X and Y directions. In this embodiment, the mask M and semiconductor wafer W are positioned in a state close to each other (with a gap on the order of 10 to 100 μm between the mask M and the semiconductor wafer W).

Subsequently, in the main chamber 12 under reduced pressure, the electron beam irradiating part 22 starts emitting an electron beam. The electron beam emitted from the electron gun 26 of the electron beam irradiating part 22 is collimated by the lens 28 and is swept by the deflector 30, so that the whole surface of the mask M is scanned therewith. As a consequence, a desirable mask pattern is transferred onto a resist on the semiconductor wafer W with the magnification of 1:1.

While the foregoing steps are repeated so that a predetermined number of exposure operations are carried out, the wafer stage 34 is drawn out from within the main chamber 12 for maintenance periodically or when a sudden trouble occurs. At the time of maintenance, the control console 16 is initially moved from the normal operating position of FIG. 15 to the maintenance position of FIG. 1 while being guided along the rails 202 on the installation surface (step S101: housing positioning step). Here, the cables 180 accommodated in the space 200 provided under the control console 16 are extended.

Next, as shown in FIGS. 18 and 19, the guide rail 210 is mounted so as to bridge the main chamber 12 and the container 206 of the control console 16 (step S102: bridging step). Here, one end of the guide rail 210 is received by the rail receiver 218 on the container 206 side, whereas the other end is received by the rail receiver 222 on the main chamber 12 side. Then, the bolts 224 of the rail receiver 222 are rotated so as to adjust their heights, whereby the inclination of the guide rail 210 is regulated so as to tilt by several millimeters toward the container 206 (step S103).

Figure 28:
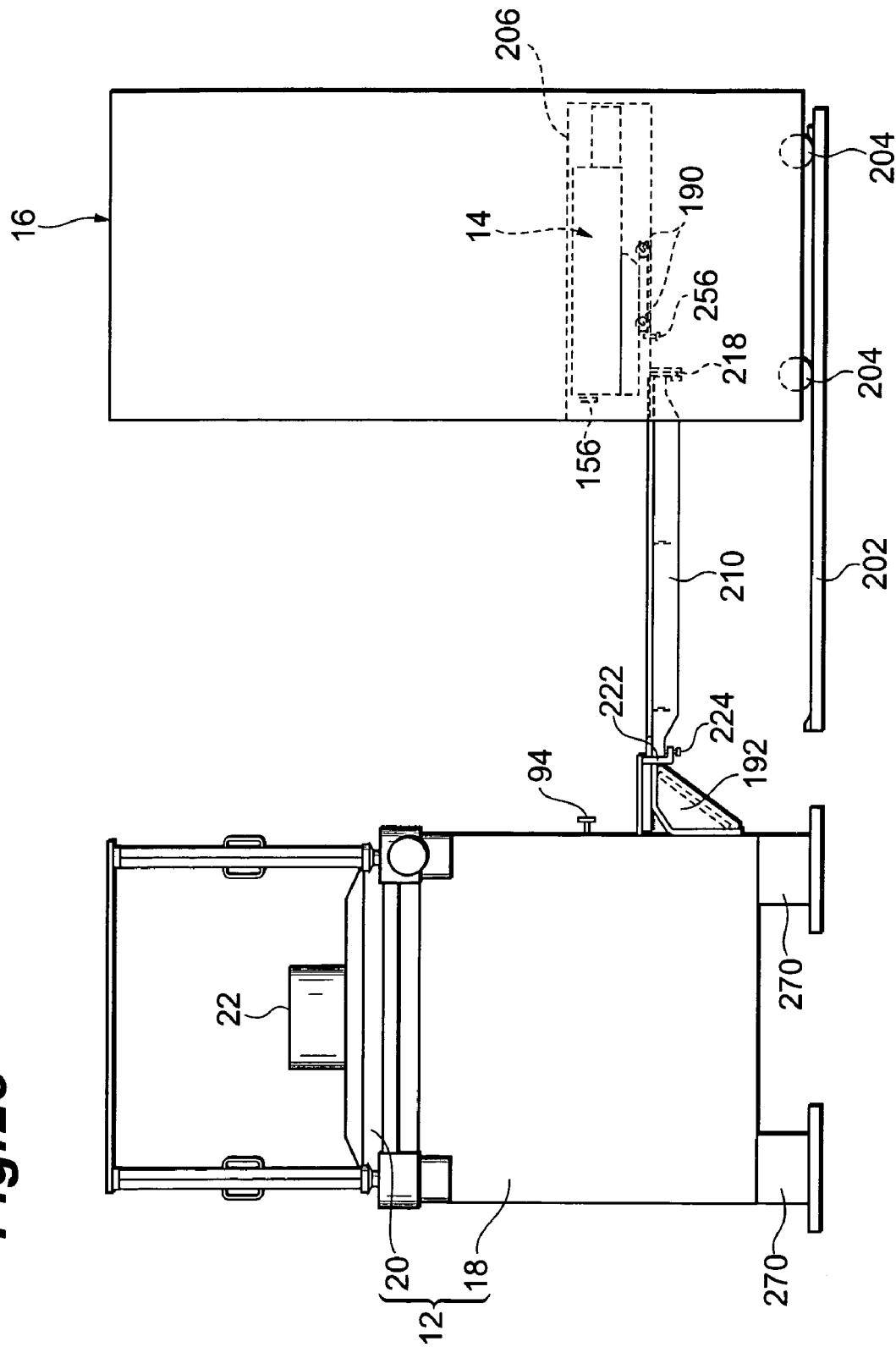
FIG. 28 is a front view showing a state where the sub-chamber moved while being guided by a guide rail is accommodated in the container.

Subsequently, after removing the bellows 95, the connection between the driving rod 156 of the sub-chamber 14 and the connecting rod 94 of the wafer stage 34 is broken (step S104: connection breaking step). Then, the sub-chamber 14 is moved to the container 206 and accommodated therein while being guided on the guide rail 210 by way of the wheels 190 as shown in FIG. 28 (step S105: sub-chamber accommodating step). Thereafter, the leading end of a bolt 256 is projected from the lower side of the mounting surface of the container 206, so as to function as a wheel stopper, thereby positioning the sub-chamber 14 and preventing it from jumping out of the container 206.

Figure 29:
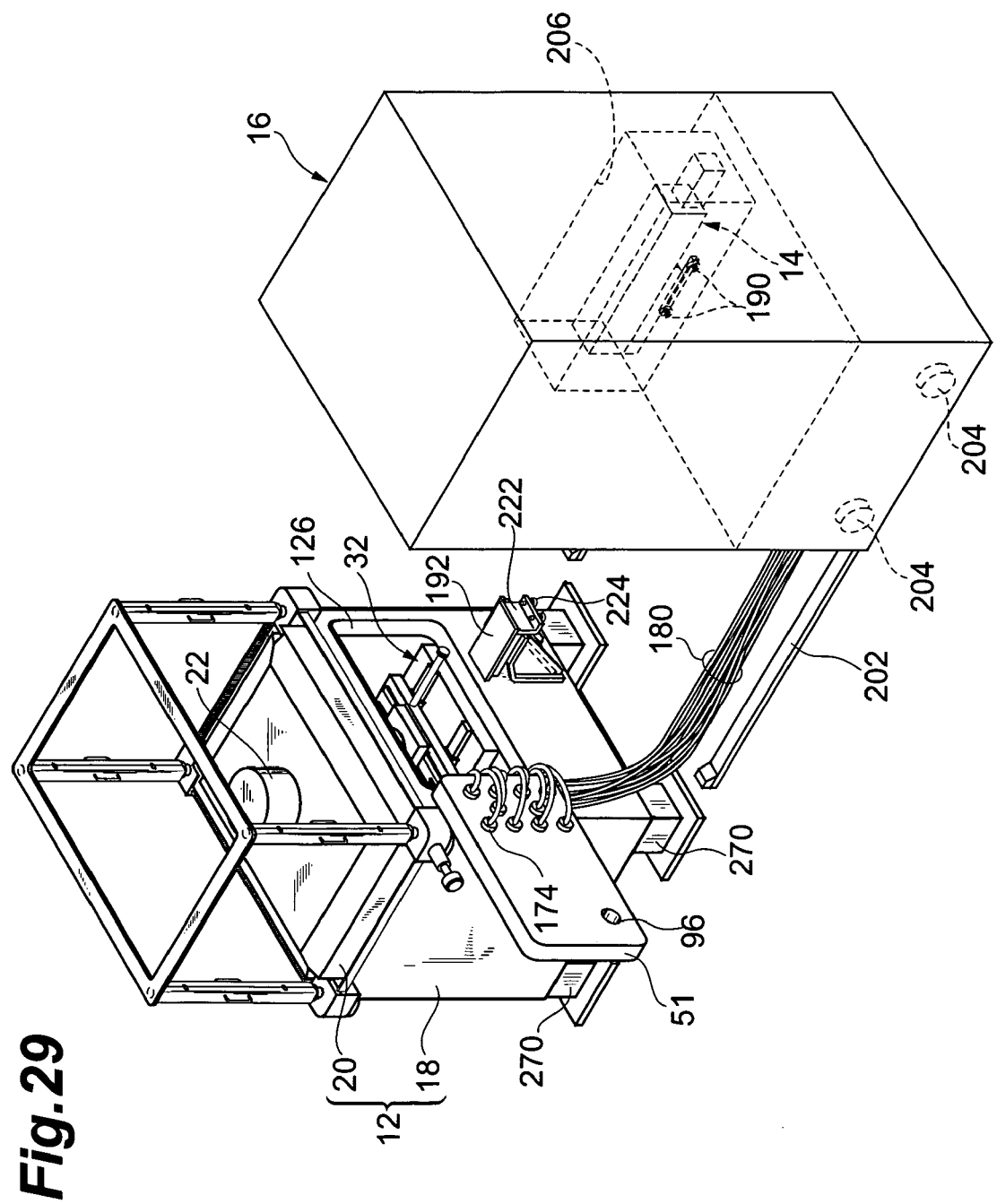
FIG. 29 is a perspective view showing a state where the guide rail is removed from the state shown in FIG. 28 and a door is opened.

Next, the guide rail 210 bridging the main chamber 12 and the control console 16 is removed (step S106), and the door 51 of the main chamber 12 is opened as shown in FIG. 29 (step S107).

Subsequently, as shown in FIGS. 21 and 22, the trestle 226 is inserted between the main chamber 12 and the control console 16 (step S108). If a plate 225 is provided so as to bridge the rails 202 for guiding the control console 16 on the installation surface, and the cables 180 are laid out under the plate 225, the cables 180 will not hinder the trestle 226 from being placed. Then, as shown in FIG. 23, the bracket 234 attached to one end of the rails 230 on the trestle 226 is connected to the leading end part of the sub-chamber 14 accommodated in the container 206. On the other hand, as shown in FIG. 24, the bracket 236 attached to the other end of the rails 230 on the trestle 226 is connected to the main chamber 12. Thus, the trestle 226 is positioned between the main chamber 12 and the control console 16.

Then, as shown in FIG. 25, the wafer stage 34 is drawn onto the trestle 226 while the stage base 32 is guided on the rails 230 by way of the wheels 40 (step S109: substrate holder drawing step). This enables the maintenance of the wafer stage 34 such as cleaning on the outside of the main chamber 12.

Figure 30:
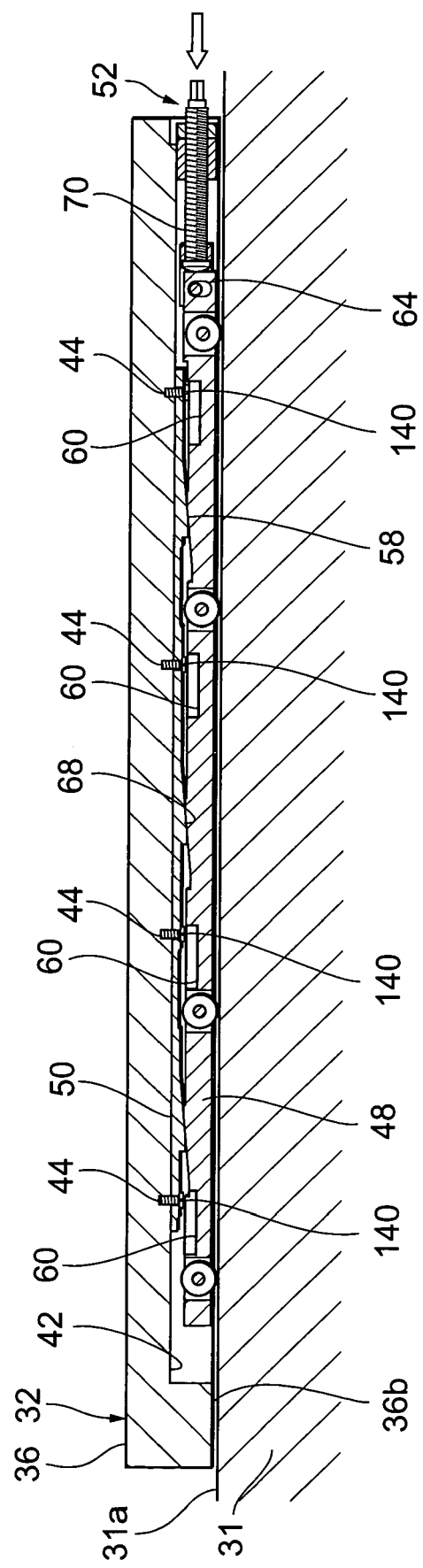
FIG. 30 is a sectional view showing a state where the base body rises at the time of maintenance, so that the bottom face of the base body is detached from the upper face of the bed.

Here, the wafer stage 34 is drawn out in the following manner. First, as shown in FIGS. 3A and 3B, the clamping of the stage base 32 with the clamp members 108 is released. Subsequently, as shown in FIG. 30, the screw rod 70 of the operating part 52 of each elevator 38 is rotated, so as to slide the carriage 48 with respect to the guide 50, thereby pushing the carriage 48 leftward in FIG. 30. As a consequence, the inclined surfaces 68 of the guide 50 ascend while sliding on the inclined surfaces 58 of the carriage 48, whereby the base body 36 as a whole rises slightly (about 3 mm).

Figure 31:
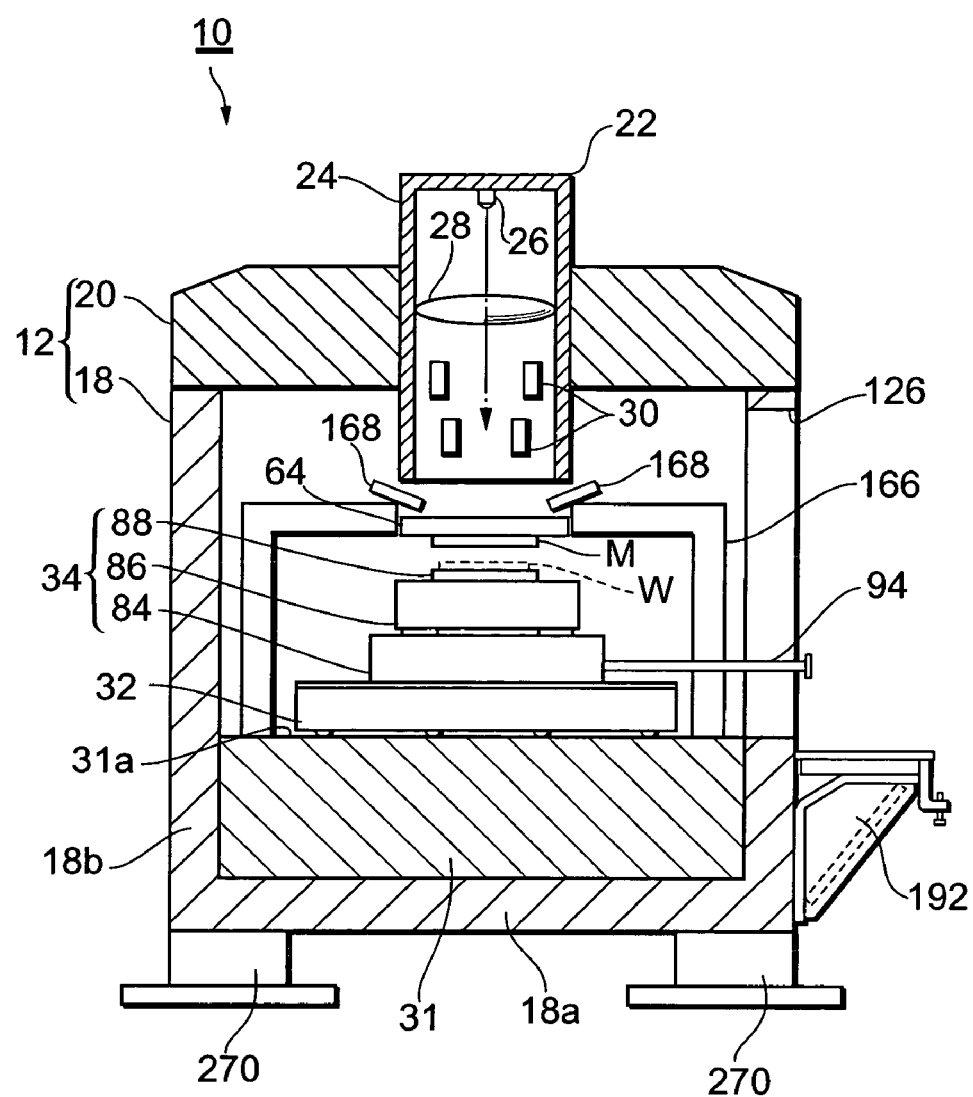
FIG. 31 is a sectional view showing a state where the bottom face of the base body is detached from the upper face of the bed, so that the stage base is movable on the bed by wheels.

As shown in FIGS. 30 and 31, the bottom face of the base body 36 is separated from the upper face 31a of the bed 31 in this stage, whereby the stage base 32 is movable on the bed 31 by way of the wheels 40. While the operating part 52 ascends together with the base body 36, the carriage 48 is still on the bed 31, since the joint 72 of the operating part 52 is vertically movable along the elongated hole 164 of the carriage 48 by way of the pin 182. There may be a fear of screws 140 for attaching the guide 50 to the base body 36 interfering with the carriage 48 when the carriage 48 is slid with respect to the guide 50. However, since the upper face of the carriage 48 is formed with the four recesses 60, the heads of the screws 140 are accommodated in the recesses 60 without any fear of interference.

In this embodiment, actions of the X stage 84 and Y stage 86 may further be tested by way of the following steps. When testing the actions of the X stage 84 and Y stage 80, the right wall of the stage base 32 is initially brought into contact with the protrusions 238 disposed on a pair of rails 230 as shown in FIG. 25. On the other hand, as shown in FIG. 26, the male screw 252 is caused to mesh with the screw hole 240 in a side face of the rails 230 by way of elongated hole 250, so as to secure the stopper 244 to the side face of the rails 230. Here, the elongated hole 250 positions the stopper 244 along the X axis, and the abutment 248 is brought into contact with the left wall of the stage base 32. As a consequence, the stage base 32 is positioned between the protrusions 238 and the stopper 244 and is restrained from shifting along the X axis (step S110).

Subsequently, the driving rod 156 of the sub-chamber 14 accommodated in the container 206 of the control console 16 and the connecting rod 94 of the X stage 84 are connected to each other (step S111: connecting step). Then, the motor 83 of the sub-chamber 14 is driven, so as to test the action of the X stage 84. Also, the ultrasonic motor 104 on the X stage 84 is driven, so as to test the action of the Y stage (step S112). As such, the actions of the X stage 84 and Y stage 86 are determined on the outside of the main chamber 12, and a maintenance operation such as fine adjustment is carried out when necessary. The foregoing steps complete the maintenance for the wafer stage 34.

When the maintenance is completed, the connection between the driving rod 156 and the connecting rod 94 is broken. Also, the stopper 244 fixed to the rail 230 is removed. Then, the wafer stage 34 is returned into the main chamber 12 while being guided with the rails 230. Subsequently, as shown in FIG. 3B, the stage base 32 is temporarily positioned by the three positioning pins 106.

Next, as shown in FIG. 11, the screw rod 70 of each operating part 52 is rotated, so as to slide the carriage 48 of the elevator 38 with respect to the guide 50, thereby bringing back the carriage 48 rightward in the drawing. As a consequence, the inclined surfaces 68 of the guide 50 descend while sliding on the inclined surfaces 58 of the carriage 48, whereby the base body 36 moves down. Then, as shown in FIG. 3B, the stage base 32 is precisely positioned by the three positioning pins 106 and four clamp members 108.

Subsequently, the connection between the sub-chamber 14 and the bracket 234 and the connection between the main chamber 12 and the bracket 236 are broken, and the trestle 226 is removed from between the main chamber 12 and the control console 16. Then, the door 51 is closed, so as to cover the opening 126 of the main chamber 12.

Next, the guide rail 210 is disposed so as to bridge the main chamber 12 and the container 206 of the control console 16. Here, the bolts 224 of the rail receiver 222 are rotated so as to adjust their heights, whereby the inclination of the guide rail 210 is regulated so as to make it rise by several millimeters toward the main chamber 12.

Subsequently, the sub-chamber 14 is moved while being guided on the guide rail 210, so as to be mounted on and supported by the support table 192. Then, the connecting rod 94 of the wafer stage 34 having an end part projecting out of the main chamber 12 by way of the through hole 96 of the door 51 is connected to the driving rod 156 of the sub-chamber 14, and their junction is covered with the bellows 95. Thereafter, the guide rail 210 bridging the main chamber 12 and the container 206 of the control console 16 is removed.

Finally, as shown in FIG. 15, the control console 16 is moved from the maintenance position to the normal operating position while being guided on the rails 202 disposed on the installation surface.

In the exposure apparatus 10 in accordance with this embodiment, as explained in detail in the foregoing, the bottom face 36b of the base body 36 is in contact with the upper face 31a of the bed 31 at the time of normal operation, whereby it is easier for the stage base 32 to realize a high straightness (about 3 μm here). When moving the stage base 32, on the other hand, the base body 36 can be separated from the upper face 31a of the bed 31 by the elevators 38 and moved on the bed 31 by way of the wheels 40, whereby there is no fear of the maintenance property deteriorating.

Since the bottom face 36b of the base body 36 in the exposure apparatus 10 in accordance with this embodiment is provided with the recesses 42 in which the respective elevators 38 are accommodated, the space can be utilized effectively. This restrains the main chamber 12 from increasing its size and alleviates the load on a vacuum pump and the like.

The upper face 58 of the carriage 48 of each elevator 38 in the exposure apparatus 10 in accordance with this embodiment includes the inclined surfaces 58, whereas the lower face of the guide 50 of the elevator 38 includes the inclined surfaces 68 in contact with their corresponding inclined surfaces 58. When the carriage 48 is slid with respect to the guide 50 by way of the operating part 52, the inclined surfaces 68 ascend or descend while sliding on the inclined surfaces 58, whereby the base body 36 moves up or down. Such elevators 38 of so-called jack-up type can move the base body 36 up and down quite easily.

In particular, since the exposure apparatus 10 in accordance with this embodiment is the proximity exposure apparatus 10 utilizing an electron beam, in which the mask M and the semiconductor wafer W are arranged close to each other with a distance therebetween on the order of several micrometers to several tens of micrometers, the levelness of the semiconductor wafer W is quite important for carrying out accurate exposure of the semiconductor wafer W without interfering with the mask M. Here, as mentioned above, the stage base 32 can easily realize a high straightness, so that the semiconductor wafer W positioned and held by the wafer stage 34 can easily be made horizontal, whereby the semiconductor wafer W can accurately be exposed to the electron beam without interfering with the mask M.

In this embodiment, while breaking the connection between the driving rod 156 and the connecting rod 94 of the wafer stage 34, the sub-chamber 14 can be moved to and accommodated in the container 206 while being guided by the guide rail 210. Therefore, the door 51 can easily be opened regardless of the sub-chamber 14, and the maintenance for the wafer stage 34 can be carried out on the outside of the main chamber 12. After the maintenance is completed, the door 51 is closed, and the sub-chamber 14 can be moved from the container 206 to the main chamber 12 while being guided by the guide rail 210, whereby the driving rod 156 and the connecting rod 94 of the wafer stage 34 can be connected to each other again. Such a simple operation enables maintenance, thereby improving the maintenance property.

In this embodiment, the sub-chamber 14 can easily be moved by rotations of the wheels 190 attached to the bottom face of the sub-chamber 14, which further improves the maintenance property.

In this embodiment, the control console 16 is movable on the installation surface, and can accommodate at least a part of the sub-chamber 14 into the container 206 when located at a position adjacent the main chamber 12. Therefore, the footprint can be reduced if the control console 16 is disposed adjacent the main chamber 12 at the time of normal operation.

Adjusting the inclination of the guide rail 210, which is provided in the main chamber 12 and bridges the main chamber 12 and the container 206 in this embodiment, makes it easier to move the sub-chamber between the main chamber 12 and the container 206, thereby further improving the maintenance property.

In this embodiment, the door 51 is adapted to open and close by way of the hinges 172, whereas the terminals 174 for introducing a current into the main chamber 12 are disposed near the hinges 172 of the door 51, so that the positions of terminals 174 fluctuate less between before and after opening/closing the door 51, which makes it unnecessary to break the connection between the terminals 174 and their corresponding connectors 178 in the main chamber 12 each time when the door 51 is opened/closed, thereby further improving the maintenance property.

Since the trestle 226 is placed between the main chamber 12 and the container 206 in this embodiment, the wafer stage 34 drawn out of the main chamber 12 can be mounted on the trestle 226, so that the maintenance can be carried out on the outside of the main chamber 12, whereby the maintenance operation can be performed easily. Here, guiding with the rails 230 can easily move the wafer stage 34 onto the trestle 226.

When the wafer stage 34 in the state mounted on the trestle 226 is connected by way of the driving rod 156 to the sub-chamber 14 accommodated in the container 206, actions of the wafer stage 34 caused by the sub-chamber 14 can be tested on the trestle 226 in this embodiment. Here, the trestle 226 is connected to the sub-chamber 14 accommodated in and positioned by the container 206, whereas the stage base 32 is positioned on the trestle 226, so that a distance is maintained between the wafer stage 34 and the sub-chamber 14, whereby the actions of the wafer stage 34 can reliably be tested on the trestle 226.

Without being restricted to the above-mentioned embodiment, the present invention can be modified in various manners. For example, though the above-mentioned embodiment comprises the guide member 50 having the inclined surfaces 68 in contact with the inclined surfaces 58 of the carriage 48 in the elevator 38, the bottom faces of the recesses 42 in the stage base 32 may directly be processed into inclined surfaces 170 in contact with the inclined surfaces 58 of the carriage 48 as shown in FIGS. 32A and 32B. In this case, the elevator 38 includes the carriage 48, operating part 52, and inclined surfaces 170.

Though the above-mentioned embodiment relates to an embodiment of the electron beam proximity exposure apparatus 10 as a substrate processing apparatus, it is not restrictive, so that the stage base 32 of this embodiment can also be employed in other processing apparatus. For example, the stage base of the present invention can be employed in electron beam lithography systems which directly lithograph the semiconductor wafer W, and exposure apparatus using UV rays and the like as a light source.

The stage base 32 of the present invention can be employed not only in the case where the semiconductor wafer W is subjected to some processing but also in defect inspection apparatus using X-rays and electron beams. In this sense, the "processing" in the substrate processing apparatus in accordance with the present invention includes defect inspections as well.

The present invention is applicable not only to the processing of the semiconductor wafer W but also to the making of liquid crystal panels in which patterns of an ITO film and the like are formed on a glass substrate, etc.

From the foregoing explanations of the invention, it will be obvious that the same may be varied in many ways. Such variations are not to be regarded as a departure from the spirit and scope of the invention, and all such modifications as would be obvious to one skilled in the art are intended to be included within the scope of the following claims.

The disclosure of Japanese Patent Application No. 2003-170974 filed on Jun. 16, 2003 including the specification, drawings, and claims and the disclosure of Japanese Patent Application No. 2003-177025 filed on Jun. 20, 2003 including the specification, drawings, and claims are incorporated herein by reference in their entirety.

What is claimed is:

1. A stage base comprising:
    a base body having a bottom face including a recess and facing a reference surface;
    an elevator accommodated in the recess, attached to the base body and operative to move the base body in a vertical direction with respect to the reference surface; and
    a shifter, attached to the elevator, that enables the base body to move along the reference surface.

2. A stage base according to claim 1, wherein the shifter is also accommodated in the recess.

3. A stage base according to claim 1, wherein the elevator has:
    a support having an upper face including a first inclined surface tilted with respect to the reference surface;
    a guide, attached to the base body, having a lower face including a second inclined surface in contact with the first inclined surface; and
    an operating part connected to the support and operative to slide the support with respect to the guide.

4. A stage base according to claim 3, wherein the shifter has a wheel attached to the support.

5. A substrate processing apparatus comprising:
    the stage base according to claim 1;
    a stage mounted on the stage base and operative to position a substrate;
    a chamber accommodating the stage base mounted with the stage, the chamber having a side wall including an opening that allows the stage base mounted with the stage to pass through; and
    a door, attached to the chamber, that covers the opening.

6. A substrate processing apparatus according to claim 5, wherein the substrate processing apparatus is a proximity exposure apparatus utilizing an electron beam.

7. A stage base comprising:
    a base body having a bottom face including a recess and facing a reference surface; and
    an elevator accommodated in the recess, attached to the base body and operative to move the base body in a vertical direction with respect to the reference surface;
    wherein the stage base is movable along the reference surface when the base body has been raised by the elevator so as to be detached from the reference surface.

8. A stage base comprising:
    a base body having a bottom face including a recess and facing a reference surface;
    an elevator for moving the base body in a vertical direction with respect to the reference surface, the elevator being accommodated in the recess; and
    a shifter for enabling the base body to move along the reference surface.

9. A stage maintenance method comprising the steps of:
    moving a base body in a vertical direction so as to be detached from a reference surface, wherein the base body has a bottom face including a recess that accommodates an elevator therein; and
    drawing the base body mounted with a stage out of a chamber by moving the base body along the reference surface.

10. A substrate processing apparatus comprising:
    a main chamber;
    a sub-chamber disposed outside of the main chamber and attachable/detachable to the main chamber; and
    a container having a space that allows at least a part of the sub-chamber to be accommodated therein.

11. A substrate processing apparatus according to claim 10, wherein the sub-chamber is accommodated in the container when the sub-chamber has been detached from the main chamber.

12. A substrate processing apparatus according to claim 10, wherein a substrate holder positioning and holding the substrate is provided in the main chamber; and
    wherein the sub-chamber has:
    a driving rod extending in a predetermined direction; and
    a driving source displacing the driving rod in the predetermined direction;
    whereby the substrate holder can be positioned in the predetermined direction.

13. A substrate processing apparatus according to claim 12, wherein the main chamber has a side wall part including an opening and a door covering the opening; and
    wherein the driving rod of the sub-chamber is attachable/detachable to the substrate holder by way of a through hole provided in the door.

14. A substrate processing apparatus according to claim 10, further comprising a guide mechanism attachable/detachable between the main chamber and the container, guiding a movement of the sub-chamber to and from the container.

15. A substrate processing apparatus according to claim 10, further comprising a housing movable on an installation surface;
    wherein the container is provided within the housing and accommodates at least a part of the sub-chamber attached to the main chamber when the housing is positioned adjacent the main chamber.

16. A substrate processing apparatus according to claim 13, further comprising a trestle, placed between the main chamber and the container, mounting the substrate holder drawn out of the main chamber through the opening.

* * * * *